(12) United States Patent
Lin et al.

(10) Patent No.: US 9,688,858 B1
(45) Date of Patent: Jun. 27, 2017

(54) BACTERIOCHLORIN-BASED ORGANIC DYE

(71) Applicant: National Chi Nan University, Puli, Nantou (TW)

(72) Inventors: Ching-Yao Lin, Puli (TW); Subrata Chakraborty, Puli (TW); Chin-Li Wang, Puli (TW)

(73) Assignee: NATIONAL CHI NAN UNIVERSITY, Puli (TW)

( * ) Notice: Subject to any disclaimer, the term of this patent is extended or adjusted under 35 U.S.C. 154(b) by 0 days.

(21) Appl. No.: 15/390,266

(22) Filed: Dec. 23, 2016

(30) Foreign Application Priority Data

Apr. 13, 2016 (TW) .............................. 105111516 A

(51) Int. Cl.
| | | |
|---|---|---|
| *C07B 47/00* | (2006.01) | |
| *C09B 47/00* | (2006.01) | |
| *H01G 9/20* | (2006.01) | |
| *H01L 51/00* | (2006.01) | |

(52) U.S. Cl.
CPC ........... *C09B 47/00* (2013.01); *H01G 9/2059* (2013.01); *H01L 51/0077* (2013.01)

(58) Field of Classification Search
CPC ...................................................... C09B 47/00
See application file for complete search history.

(56) References Cited

U.S. PATENT DOCUMENTS

| | | |
|---|---|---|
| 7,534,807 B2 | 5/2009 | Kim et al. |
| 2003/0203888 A1 | 10/2003 | Boyle et al. |

FOREIGN PATENT DOCUMENTS

| | | | |
|---|---|---|---|
| TW | 201440288 A | 10/2014 | |

OTHER PUBLICATIONS

Chernook et al. "Complexation and Interchromophoric Interactions in Self-Organized Porphyrin and Chlorin Triads" J. Phys. Chem., 1996, vol. 100, No. 5, pp. 1918-1926.*

Pandey, R.K., "Synthetic Strategies in Designing Porphyrin-Based Photosensitizers for Photodynamic Therapy," in W. Horspool and F. Lenci (eds.), CRC Handbook of Organic Photochemistry and Photobiology, 2nd ed., CRC Press LLC, Boca Raton, Fla., 2003, pp. 144-3-144-4 (boxed sections).

* cited by examiner

*Primary Examiner* — Joseph Kosack
(74) *Attorney, Agent, or Firm* — Christensen O'Connor Johnson Kindness PLLC

(57) ABSTRACT

Disclosed herein is a bacteriochlorin-based organic dye represented by Formula (II):

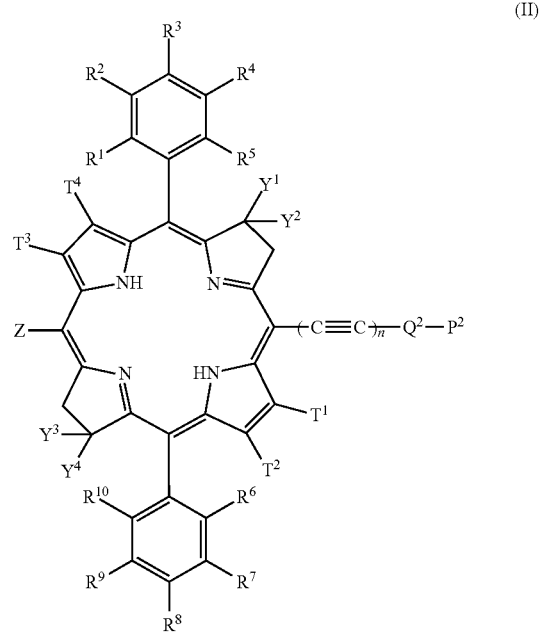

(II)

wherein the substituents contained in Formula (II) are as defined herein. The bacteriochlorin-based organic dye is stable in air, and may be used as a photosensitizer in dye-sensitized solar cell.

16 Claims, 2 Drawing Sheets

BACTERIOCHLORIN-BASED ORGANIC DYE

CROSS-REFERENCE TO RELATED APPLICATION

This application claims priority of Taiwanese Application No. 105111516, filed on Apr. 13, 2016.

FIELD

The disclosure relates to an organic dye, and more particularly to a bacteriochlorin-based organic dye.

BACKGROUND

In the development of solar cell applications, dye-sensitized solar cells (DSSCs) have a high potential. A photosensitizer contained in DSSCs absorbs visible light and ultraviolet light in sunlight, and electrons contained in the photosensitizer are thus excited and effectively introduced to a conduction band of a semiconductor electrode so as to produce a photocurrent. Therefore, the quality of the photosensitizer may affect the photoelectric conversion efficiency of DSSCs. The photosensitizer commonly used in DSSC includes ruthenium complexes, porphyrin derivatives, and small molecular organic photosensitizers having electron-donating and electron-withdrawing structures.

US 2003/0203888 A1 discloses a bacteriochlorin chromophore represented by Formula (A):

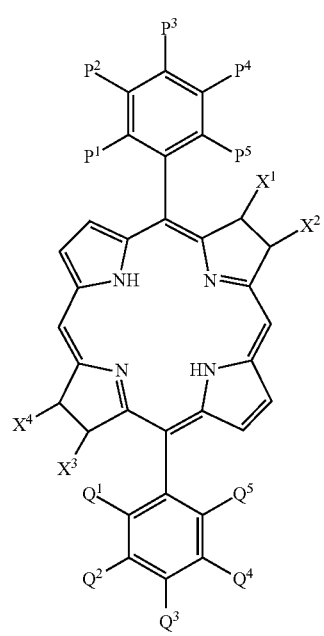

(A)

wherein
$X^1$, $X^2$, $X^3$, and $X^4$ are independently selected from the group consisting of H, OH, halo, a $C_1$-$C_4$ alkyl group, and a $C_1$-$C_3$ alkoxy group; and
$P^1$, $P^2$, $P^3$, $P^4$, $P^5$, $Q^1$, $Q^2$, $Q^3$, $Q^4$, and $Q^5$ are independently selected from the group consisting of H, OH, CN, $NO_2$, halo, a $C_1$-$C_{15}$ alkyl, and a $C_1$-$C_{15}$ alkoxy group.

As disclosed in Scheme 1 of US 2003/0203888 A1, a carbon-carbon double bond at β-position of one or two pyrrole rings of a porphyrin compound is reduced using oxmium tetraoxide as a catalyst to produce a chlorin compound and a bacteriochlorin compound. However, the bacteriochlorin compound prepared from the porphyrin compound in US 2003/0203888 A1 has no or only one substituent on each of the carbon atoms at positions 7, 8, 17, and 18 of a multi-cyclic core. In addition, it is indicated in the CRC Handbook of Organic Photochemistry and Photobiology, Volumes 1 & 2 (Second Edition, Sep. 29, 2003) by William M. Horspool et al., Page 144-3 that the bacteriochlorin compound prepared from the porphyrin compound via reduction is found to be air sensitive. The bacteriochlorin compound thus prepared is liable to be oxidized to the porphyrin compound or the chlorin compound, and may not be used for subsequent applications over a long period of time. The bacteriochlorin compound prepared from the porphyrin compound using oxmium tetraoxide as a catalyst, as disclosed in US 2003/0203888 A1, may similarly have the air sensitive problem.

U.S. Pat. No. 7,534,807 discloses a method of making a bacteriochlorin, which is carried out by condensing a pair of compounds of Formula II defined therein in an organic solvent and preferably in the presence of an acid.

SUMMARY

An object of the disclosure is to provide a bacteriochlorin-based organic dye which is stable in air.

According to the disclosure, there is provided a bacteriochlorin-based organic dye represented by Formula (II):

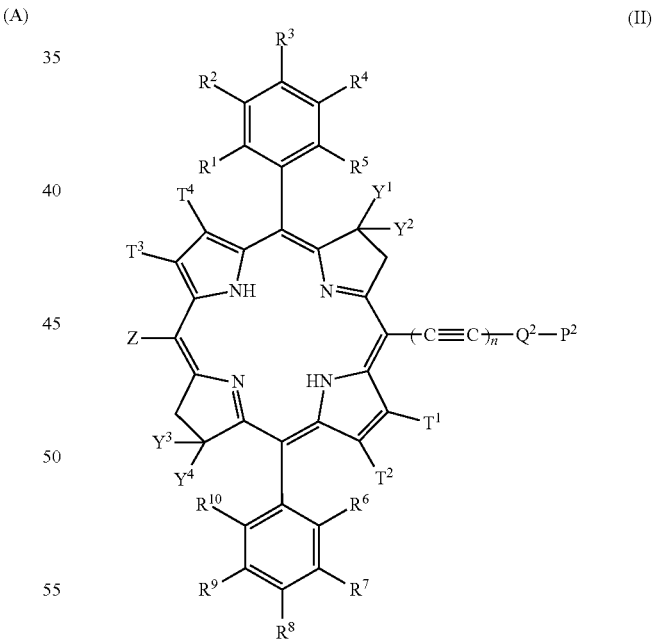

(II)

wherein
$R^1$, $R^2$, $R^3$, $R^4$, $R^5$, $R^6$, $R^7$, $R^8$, $R^9$, and $R^{10}$ are independently selected from the group consisting of hydrogen, an alkyl group, and an alkoxy group;
$Y^1$, $Y^2$, $Y^3$, and $Y^4$ independently represent an alkyl group;
$T^1$, $T^2$, $T^3$, and $T^4$ are independently selected from the group consisting of hydrogen, an alkyl group, and an alkoxy group;

$Q^2$ is selected from the group consisting of a single bond,

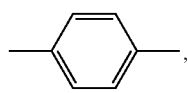,

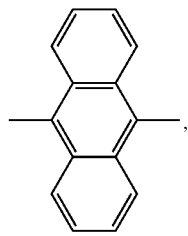,

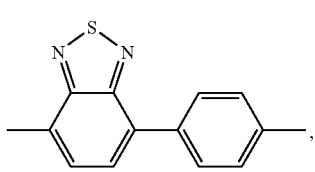,

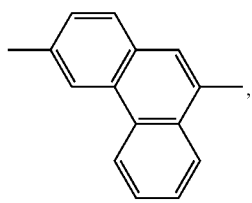,

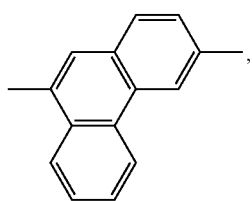,

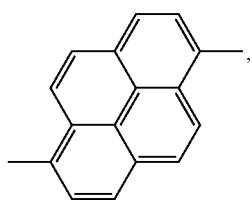,

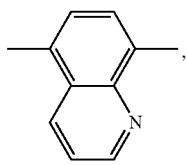, and

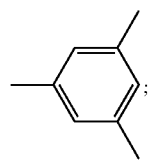;

$P^2$ represents an amino group or an anchoring group;

n represents 0 or 1; and

Z represents H,

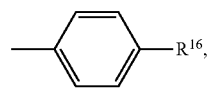, or $NR^{14}R^{15}$, wherein $P^1$ represents hydrogen, an electron-donating group, or an electron-withdrawing group, m represents 0 or 1, $R^{14}$ and $R^{15}$ are independently selected from the group consisting of hydrogen, a $C_1$-$C_{12}$ alkyl group, and

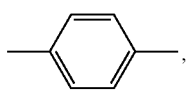, wherein $R^{16}$ represents a $C_1$-$C_{12}$ alkyl group or a $C_1$-$C_{12}$ alkoxy group, and $Q^1$ is selected from the group consisting of a single bond,

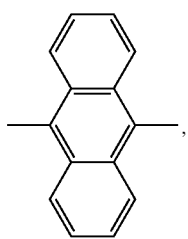,

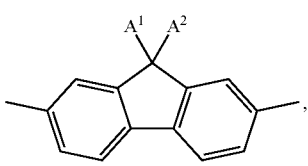

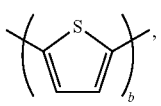

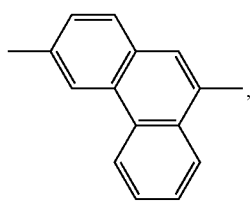

and

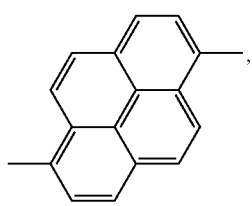

wherein $A^1$ and $A^2$ independently represent a $C_1$-$C_{12}$ alkyl group, and b represents an integer ranging from 1 to 4.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
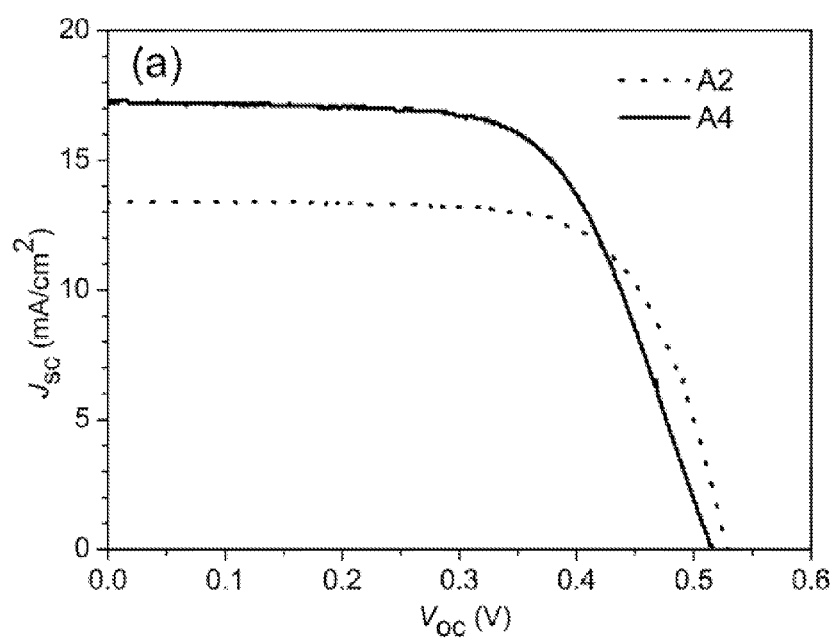
FIG. 1 is a graph showing current density-voltage (J-V) curves of Compounds A2 and A4 obtained using a a solar simulator (AM 1.5G, SS50 AAAEM, PET, irradiance: 100 mW/cm$^2$)

A bacteriochlorin-based organic dye of the disclosure is represented by Formula (II):

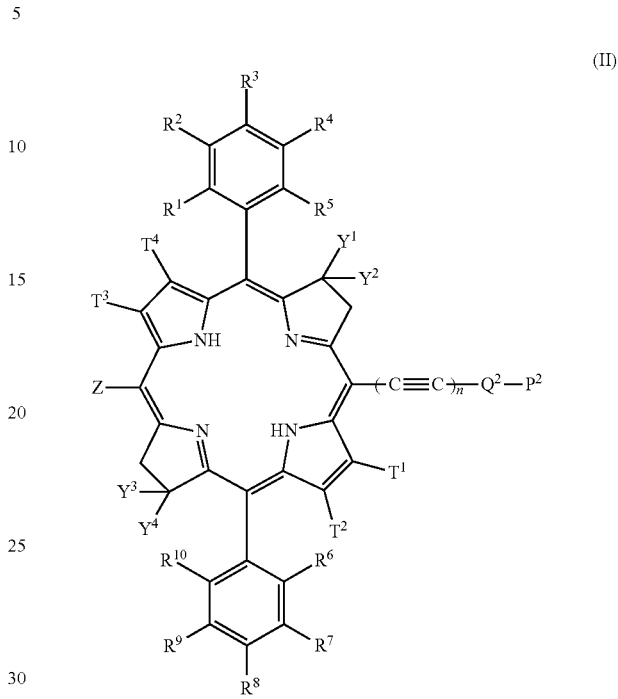

wherein
$R^1$, $R^2$, $R^3$, $R^4$, $R^5$, $R^6$, $R^7$, $R^8$, $R^9$, and $R^{10}$ are independently selected from the group consisting of hydrogen, an alkyl group, and an alkoxy group;

$Y^1$, $Y^2$, $Y^3$, and $Y^4$ independently represent an alkyl group;

$T^1$, $T^2$, $T^3$, and $T^4$ are independently selected from the group consisting of hydrogen, an alkyl group, and an alkoxy group;

$Q^2$ is selected from the group consisting of a single bond,

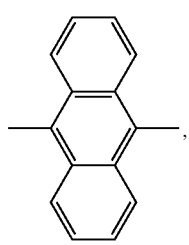

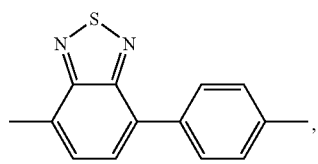

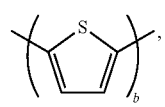,

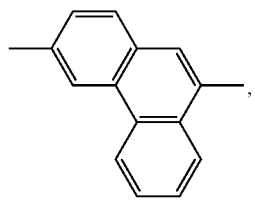,

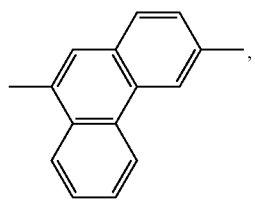,

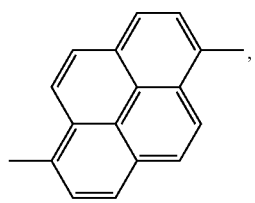,

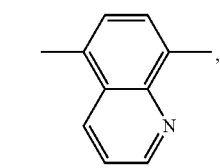, and

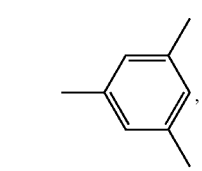,

P² represents an amino group or an anchoring group;
n represents 0 or 1; and
Z represents H,

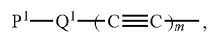, or NR¹⁴R¹⁵, wherein
P¹ represents hydrogen, an electron-donating group, or an electron-withdrawing group,
m represents 0 or 1,
R¹⁴ and R¹⁵ are independently selected from the group consisting of hydrogen, a $C_1$-$C_{12}$ alkyl group, and

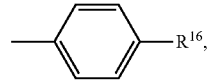, wherein R¹⁶ represents a $C_1$-$C_{12}$ alkyl group or a $C_1$-$C_{12}$ alkoxy group, and Q¹ is selected from the group consisting of a single bond,

,

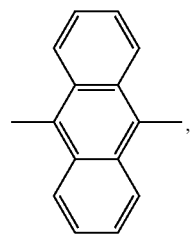,

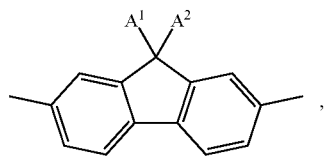,

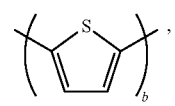,

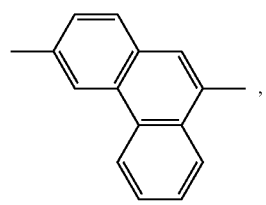,

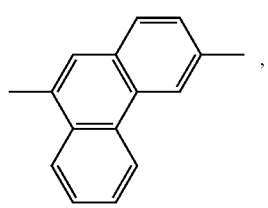, and

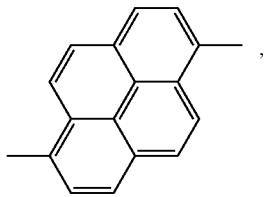

wherein $A^1$ and $A^2$ independently represent a $C_1$-$C_{12}$ alkyl group, and b represents an integer ranging from 1 to 4.

In the bacteriochlorin-based organic dye of the disclosure, there are two substituents on each of the carbon atoms at positions 7 and 17 of the bacteriochlorin core. The bacteriochlorin-based organic dye of the disclosure is stable in air, and thus may be used as a photosensitizer in a dye-sensitized solar cell.

In certain embodiments, Z represents

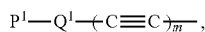

wherein $P^1$, $Q^1$, and m are defined as above.

In certain embodiments, $P^1$ is selected from the group consisting of hydrogen, $NR^{11}R^{12}$, and a hydroxyl group, wherein $R^{11}$ and $R^{12}$ are independently selected from the group consisting of hydrogen, a $C_1$-$C_{12}$ alkyl group, and

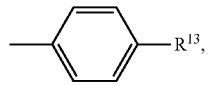

wherein $R^{13}$ represents a $C_1$-$C_{12}$ alkyl group or a $C_1$-$C_{12}$ alkoxy group. $P^2$ is selected from the group consisting of —$NH_2$, a carboxyl group, and a nitro group.

In certain embodiments, $Q^1$ is selected from the group consisting of a single bond,

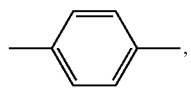

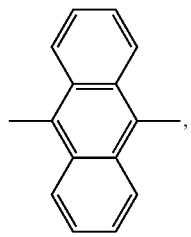

and

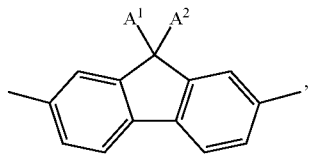

wherein $A^1$ and $A^2$ independently represent a $C_1$-$C_{12}$ alkyl group.

In certain embodiments, $Q^2$ is selected from the group consisting of

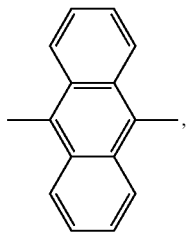

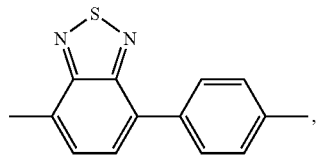

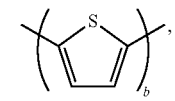

and

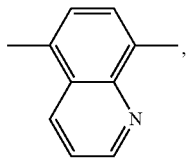

wherein b represents an integer ranging from 1 to 4.

In certain embodiments, m is 0. $Q^1$ represents a single bond. $P^1$ represents hydrogen or $NR^{11}R^{12}$, wherein $R^{11}$ and $R^{12}$ independently represent

wherein $R^{13}$ represents a $C_1$-$C_{12}$ alkyl group or a $C_1$-$C_{12}$ alkoxy group.

In certain embodiments, the alkyl group for $R^1$, $R^2$, $R^3$, $R^4$, $R^5$, $R^6$, $R^7$, $R^8$, $R^9$, $R^{10}$, $Y^1$, $Y^2$, $Y^3$, $Y^4$, $T^1$, $T^2$, $T^3$, and $T^4$ is a $C_6$-$C_{12}$ alkyl group. The alkoxy group for $R^1$, $R^2$, $R^3$, $R^4$, $R^5$, $R^6$, $R^7$, $R^8$, $R^9$, $R^{10}$, $T^1$, $T^2$, $T^3$, and $T^4$ is a $C_6$-$C_{12}$ alkoxy group.

In certain embodiments, each of $R^1$, $R^2$, $R^3$, $R^4$, $R^5$, $R^6$, $R^7$, $R^8$, $R^9$, $R^{10}$ represents hydrogen.

In certain embodiments, $R^1$, $R^5$, $R^6$, and $R^{10}$ independently represent an alkyl group or an alkoxy group. Each of $R^2$, $R^3$, $R^4$, $R^7$, $R^8$, and $R^9$ represents hydrogen.

In certain embodiments, each of $T^1$, $T^2$, $T^3$, and $T^4$ represents hydrogen.

In certain embodiments, $T^1$, $T^2$, $T^3$, and $T^4$ independently represent an alkyl group or an alkoxy group.

In certain embodiments, Z represents $NR^{14}R^{15}$.

In certain embodiments, each of $R^{14}$ and $R^{15}$ represents

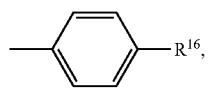

wherein $R^{16}$ represents a $C_1$-$C_{12}$ alkyl group or a $C_1$-$C_{12}$ alkoxy group.

In certain embodiments, $Q^2$ is

$P^2$ represents the anchoring group which is bonded to Q2 at a para position and which is selected from the group consisting of a carboxylic group and a hydroxamic group.

In certain embodiments, $Q^2$ is

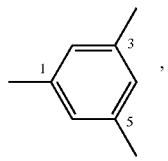

and $P^2$ represents a carboxylic group bonded to $Q^2$ at each of positions 3 and 5 of $Q^2$.

In certain embodiments, the electron-withdrawing group is selected from the group consisting of

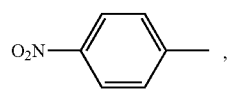

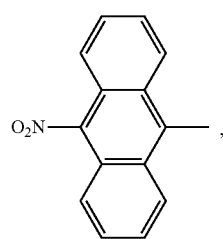 [SMILES: Cc1c2ccccc2c([N+](=O)[O-])c2ccccc12]

and

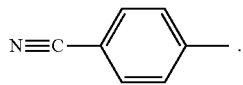

When the bacteriochlorin-based organic dye represented by Formula (II) of the disclosure is used as a photosensitizer for a dye-sensitized solar cell, $Q^1$ and $Q^2$ contained in Formula (II) may enhance the photoelectric conversion efficiency of the dye-sensitized solar cell.

In certain embodiments, when Z, $P^1$, and/or $P^2$ in Formula (II) represent(s) an amino group, the bacteriochlorin-based organic dye represented by Formula (II) of the disclosure may be formed into a film via polymerization or electropolymerization. The film may be used, for example, for modifying an electrode surface.

Specifically,

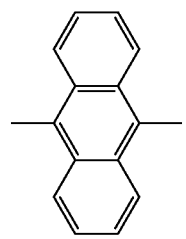

is a chromophore. When a photosensitizer contains

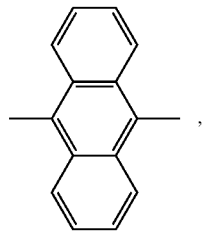

the wavelength range of sunlight which may be absorbed by the photosensitizer may be increased. Therefore, the photoelectric conversion efficiency of the dye-sensitized solar cell may be increased.

When $Q^1$ is

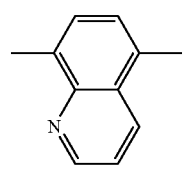

or

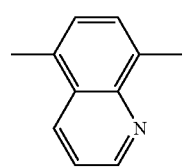

and $P^1$ is a hydroxyl group, an enhanced anchoring group is formed on the photosensitizer such that the photosensitizer may be firmly and stably anchored onto a semiconductor. Therefore, the photoelectric conversion efficiency of the dye-sensitized solar cell may be enhanced in long-term use.

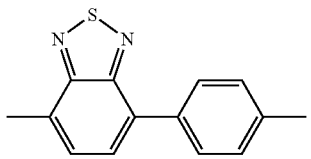

is an electron-withdrawing group, and may be used in combination with a proper electron-donating group to enhance an "electron push-pull effect" so as to enhance an effect of introduction of electrons from the photosensitizer to a semiconductor. Therefore, the photoelectric conversion efficiency of the dye-sensitized solar cell may be increased.

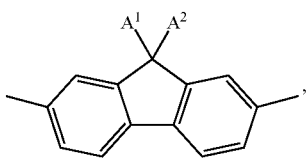

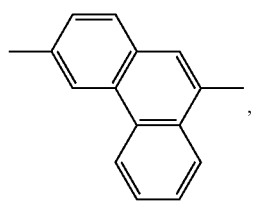

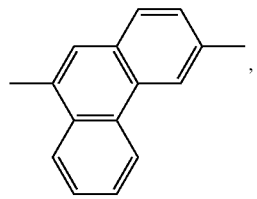

and

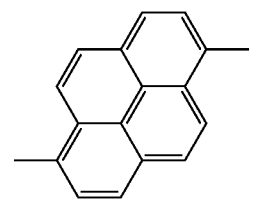

are rigid so as to enhance the chemical structure of the photosensitizer and have a high fluorescent quantum yield. Therefore, the life cycle of the photosensitizer may be extended, the probability of introduction of electrons from the photosensitized to the semiconductor may be increased, and the photoelectric conversion efficiency of the dye-sensitized solar cell may be increased.

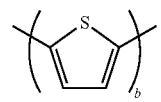

is a conductive polymeric unit, and the excellent conductivity thereof may increase the photoelectric conversion efficiency of the dye-sensitized solar cell.

When $P^1$, $P^2$, $Q^1$, $Q^2$, m, and n are as shown in Table 1, the bacteriochlorin-based organic dye of the disclosure may be used as a photosensitizer for an n-type dye-sensitized solar cell.

TABLE 1

| $P^1$ | $Q^1$ | m | n | $Q^2$ | $P^2$ |
|---|---|---|---|---|---|
| —H | Single bond | 0 | 1 | *para-phenylene* | —COOH |
| —H | Single bond | 0 | 1 | *para-phenylene* | HN—OH, C=O |
| —H | Single bond | 0 | 1 | *meta-phenylene with methyl* | —COOH |

TABLE 1-continued
| P¹ | Q¹ | m | n | Q² | P² |
|---|---|---|---|---|---|
| —H | Single bond | 0 | 1 | 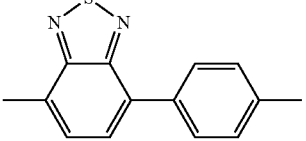 | —COOH |
| —H | Single bond | 0 | 1 | 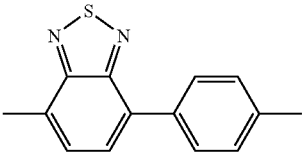 | 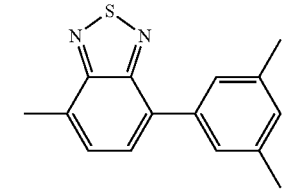 |
| —H | Single bond | 0 | 1 |  | —COOH |
| —N(C₈H₁₇)₂ |  | 1 | 1 |  | —COOH |
| —N(C₈H₁₇)₂ | 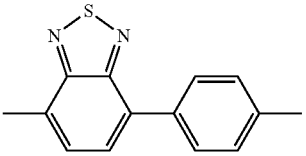 | 1 | 1 |  | —COOH |
| —N(C₈H₁₇)₂ | 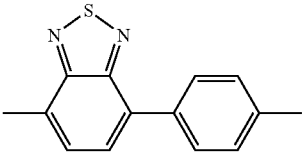 | 1 | 1 |  | 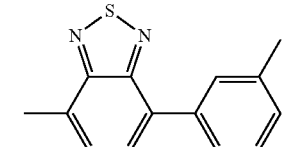 |
| —N(C₈H₁₇)₂ | 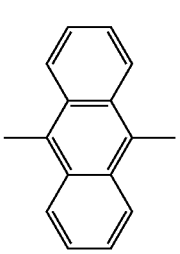 | 1 | 1 |  | —COOH |
| —N(C₈H₁₇)₂ | | 1 | 1 | | —COOH |

TABLE 1-continued

| P¹ | Q¹ | m | n | Q² | P² |
|---|---|---|---|---|---|
| —N(C₈H₁₇)₂ | 9,10-anthracenediyl | 1 | 1 | 1,4-phenylene | HN—OH, C(=O) (acetohydroxamic) |
| —N(C₈H₁₇)₂ | 9,10-anthracenediyl | 1 | 1 | 1,3,5-phenylene | —COOH |
| (C₈H₁₇)₂N—C₆H₄—C≡C— | 9,10-anthracenediyl | 1 | 1 | 4-(benzothiadiazolyl)phenylene | —COOH |
| (C₈H₁₇)₂N—C₆H₄—C≡C— | 9,10-anthracenediyl | 1 | 1 | 4-(benzothiadiazolyl)phenylene | HN—OH, C(=O) |
| (C₈H₁₇)₂N—C₆H₄—C≡C— | 9,10-anthracenediyl | 1 | 1 | 4-(benzothiadiazolyl)-3,5-phenylene | —COOH |
| —R¹¹R¹², wherein R¹¹ and R¹² represent 4-C₈H₁₇-phenyl | 9,10-anthracenediyl | 1 | 1 | 4-(benzothiadiazolyl)phenylene | —COOH |

TABLE 1-continued
| P¹ | Q¹ | m | n | Q² | P² |
|---|---|---|---|---|---|
| —R¹¹R¹², wherein R¹¹ and R¹² represent 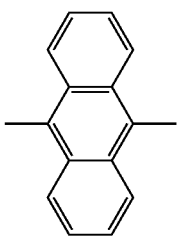 | 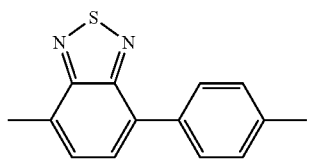 | 1 | 1 | 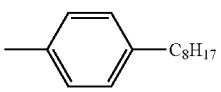 | 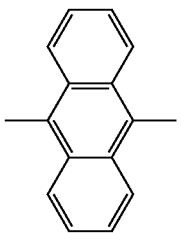 |
| —R¹¹R¹², wherein R¹¹ and R¹² represent 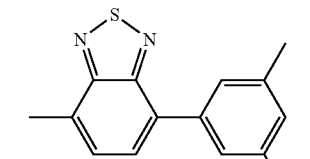 | 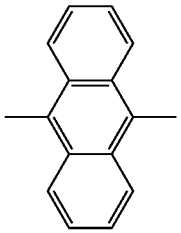 | 1 | 1 | 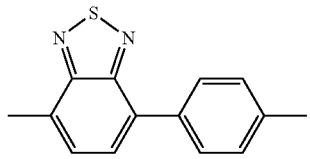 | —COOH |
| —N(C₈H₁₇)₂ | 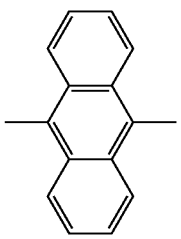 | 1 | 1 | 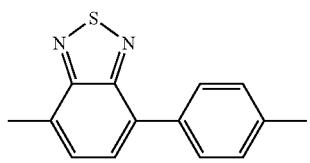 | —COOH |
| —N(C₈H₁₇)₂ | 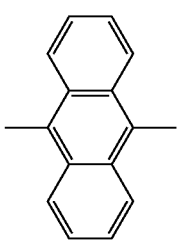 | 1 | 1 | 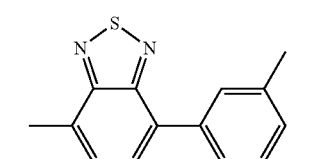 | 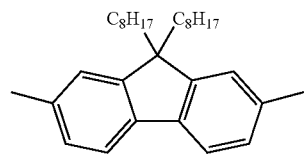 |
| —N(C₈H₁₇)₂ | 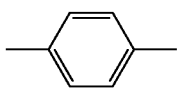 | 1 | 1 | 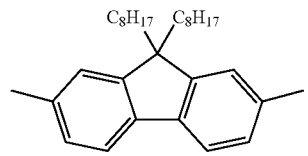 | —COOH |
| —H | 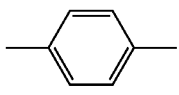 | 1 | 1 | (p-phenylene) | —COOH |
| —H | (9,9-dioctylfluorene-2,7-diyl) | 1 | 1 | (p-phenylene) | HN—OH, with C=O |

TABLE 1-continued

| P¹ | Q¹ | m | n | Q² | P² |
|---|---|---|---|---|---|
| —H | fluorene with C₈H₁₇, C₈H₁₇ | 1 | 1 | phenyl (3,5-dimethyl) | —COOH |
| —H | fluorene with C₈H₁₇, C₈H₁₇ | 1 | 1 | benzothiadiazole-phenyl | —COOH |
| —H | fluorene with C₈H₁₇, C₈H₁₇ | 1 | 1 | benzothiadiazole-phenyl | HN—OH, C(=O)CH₃ |
| —H | fluorene with C₈H₁₇, C₈H₁₇ | 1 | 1 | benzothiadiazole-(3,5-dimethylphenyl) | —COOH |
| —R¹¹R¹², wherein R¹¹ and R¹² represent  —C₆H₄—C₈H₁₇ | Single bond | 0 | 1 | phenylene | —COOH |
| —R¹¹R¹², wherein R¹¹ and R¹² represent  —C₆H₄—C₈H₁₇ | Single bond | 0 | 1 | phenylene | HN—OH, C(=O)CH₃ |
| —R¹¹R¹², wherein R¹¹ and R¹² represent  —C₆H₄—C₈H₁₇ | Single bond | 0 | 1 | phenyl (3,5-dimethyl) | —COOH |
| —R¹¹R¹², wherein R¹¹ and R¹² represent  —C₆H₄—C₈H₁₇ | Single bond | 0 | 1 | benzothiadiazole-phenyl | —COOH |

TABLE 1-continued

| P¹ | Q¹ | m | n | Q² | P² |
|---|---|---|---|---|---|
| —R¹¹R¹², wherein R¹¹ and R¹² represent —C₆H₄—C₈H₁₇ | Single bond | 0 | 1 | 4-(p-tolyl)-benzothiadiazole group | HN—OH, C(=O) (acetohydroxamic) |
| —R¹¹R¹², wherein R¹¹ and R¹² represent —C₆H₄—C₈H₁₇ | Single bond | 0 | 1 | 4-(3,5-dimethylphenyl)-benzothiadiazole group | —COOH |
| —OH | 5,8-dimethylquinoline group | 1 | 1 | 9,10-dimethylanthracene group | —NO2 |
| —OH | 5,8-dimethylquinoline group | 1 | 1 | phenylene | —NO2 |
| —N(C₈H₁₇)₂ | phenylene | 1 | 0 | thiophene-(b), wherein b is an integer from 1 to 4 | —COOH |
| —N(C₈H₁₇)₂ | phenylene | 1 | 0 | thiophene-(b), wherein b is an integer from 1 to 4 | HN—OH, C(=O) |
| —R¹¹R¹², wherein R¹¹ and R¹² represent —C₆H₄—C₈H₁₇ | Single bond | 0 | 0 | thiophene-(b), wherein b is an integer from 1 to 4 | —COOH |

TABLE 1-continued

| P¹ | Q¹ | m | n | Q² | P² |
|---|---|---|---|---|---|
| —R¹¹R¹², wherein R¹¹ and R¹² represent [–C₆H₄–C₈H₁₇] | Single bond | 0 | 0 | [–(thiophene)_b–] wherein b is an integer from 1 to 4 | HN—OH with C=O (acetohydroxamate) |

When $P^1$, $P^2$, $Q^1$, $Q^2$, m, and n are as shown in Table 2, the bacteriochlorin-based organic dye of the disclosure may be used as an electropolymerization dye.

The bacteriochlorin-based organic dye represented by Formula (II) is derived from a bacteriochlorin-based compound represented by Formula (I):

TABLE 2

| P¹ | Q¹ | m | n | Q² | P² |
|---|---|---|---|---|---|
| —H | Single bond | 0 | 1 | [–C₆H₄–] | —NH₂ |
| —N(C₈H₁₇)₂ | [–C₆H₄–] | 1 | 1 | [–C₆H₄–] | —NH₂ |
| —N(C₈H₁₇)₂ | [–anthracene–] | 1 | 1 | [–C₆H₄–] | —NH₂ |
| —H | [9,9-di(C₈H₁₇)-fluorene] | 1 | 1 | [–C₆H₄–] | —NH₂ |
| —R¹¹R¹², wherein R¹¹ and R¹² represent [–C₆H₄–C₈H₁₇] | Single bond | 0 | 1 | [–C₆H₄–] | —NH₂ |
| —NH₂ | [–C₆H₄–] | 1 | 1 | [–anthracene–] | —NO₂ |
| —NH₂ | [–C₆H₄–] | 1 | 1 | [–C₆H₄–] | —NO₂ |

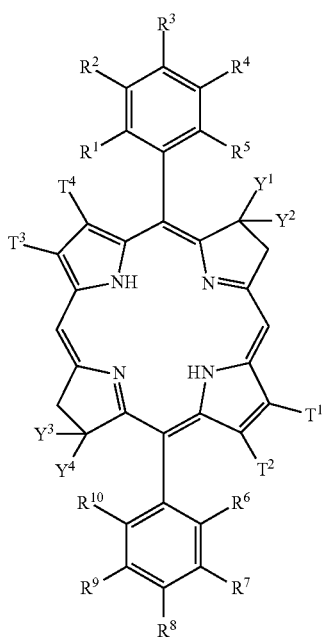

(I)

wherein $R^1$, $R^2$, $R^3$, $R^4$, $R^5$, $R^6$, $R^7$, $R^8$, $R^9$, and $R^{10}$ are independently selected from the group consisting of hydrogen, an alkyl group, and an alkoxy group;

$Y^1$, $Y^2$, $Y^3$, and $Y^4$ independently represent an alkyl group; and $T^1$, $T^2$, $T^3$, and $T^4$ are independently selected from the group consisting of hydrogen, an alkyl group, and an alkoxy group.

The bacteriochlorin-based compound represented by Formula (I) may be prepared by subjecting a compound represented by Formula (I-1) below and a compound represented by Formula (I-2) below to a reaction in the presence of a solvent and a catalyst.

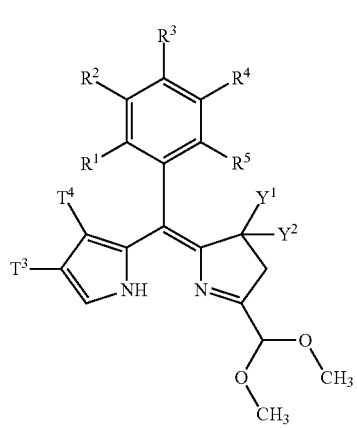

(I-1)

(wherein $R^1$, $R^2$, $R^3$, $R^4$, $R^5$, $Y^1$, $Y^2$, $T^3$, and $T^4$ are as defined above)

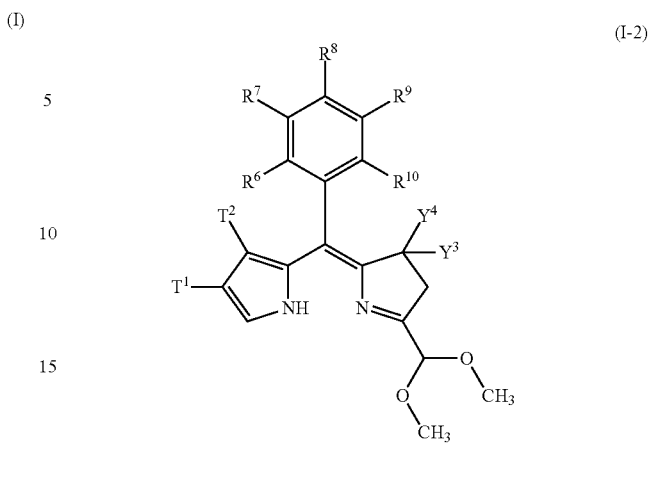

(I-2)

(wherein $R^6$, $R^7$, $R^8$, $R^9$, $R^{10}$, $Y^3$, $Y^4$, $T^1$, and $T^2$ are as defined above)

A non-limiting example of the solvent is acetonitrile ($CH_3CN$). A non-limiting example of the catalyst is boron trifluoride etherate ($BF_3 \cdot O(Et)_2$).

Examples of the disclosure will be described hereinafter. It is to be understood that these examples are exemplary and explanatory and should not be construed as a limitation to the disclosure.

Example 1

Preparation of a Bacteriochlorin-Based Compound (Compound A1):

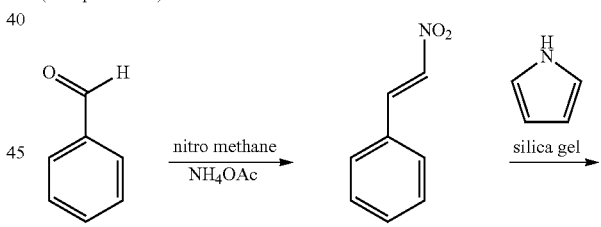

(Compound A1-1)

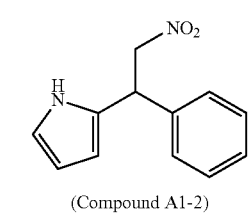

(Compound A1-2)

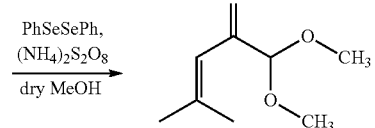

(compound A1-3)

-continued

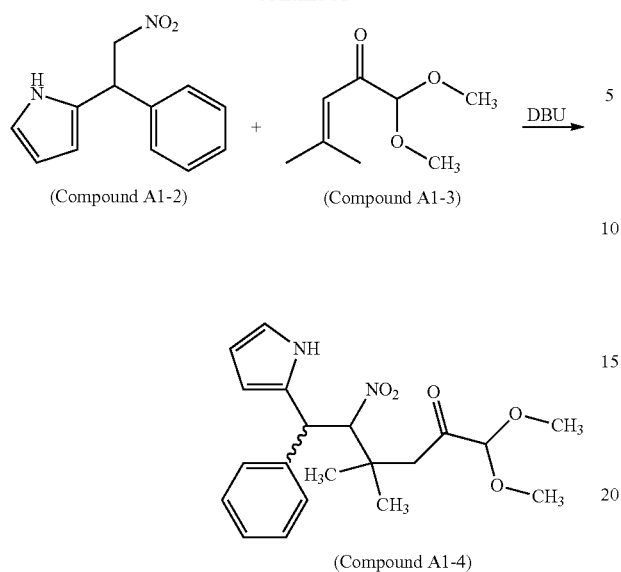

(Compound A-1)

Preparation of Compound A1-1

Benzaldehyde (10 g, 94.33 mmol), nitro methane (250 mL), and ammonium acetate (2.179 g, 28.27 mmol) were added into a round bottom bottle to obtain a reaction mixture. The reaction mixture was heated under reflux for 3 hours to obtain a reaction product. The reaction product was cooled to 25° C., and was then dissolved in a proper volume amount of methylene chloride ($CH_2Cl_2$). The reaction product was then extracted by adding water in a volume amount equal to that of methylene chloride to obtain an organic phase. The organic phase was washed with an aqueous sodium chloride solution ($NaCl_{(aq)}$), and was then dried using anhydrous sodium sulfate, followed by evacuation to obtain a coarse product. The coarse product was purified by column chromatography on a silica gel column using a 4:1 v/v mixture of n-hexane and methylene chloride as an eluent to obtain trans-β-nitrostyrene (Compound A1-1, 10.58 g, MW=149.15 g/mole, light yellow crystalline solid, yield: 75%). Spectrum analysis for Compound A1-1: $^1H$ NMR ($CDCl_3$, 300 MHz), δ (ppm): 7.43-7.53 (m, 5H); 7.58 (d, 2H, J=13.73 Hz); 7.99 (d, 1H, J=13.65 Hz). $^{13}C$ NMR ($CDCl_3$, 75 MHz): 129.2, 129.4, 130.1, 132.2, 137.1, 139.1.

Preparation of Compound A1-2

Pyrrole (1.08 g, 16.09 mmol) and Compound A1-1 (2 g, 13.41 mmol) were added to a round bottom bottle (100 mL), followed by addition of silica gel (70-230 mesh, 5 g) and homogeneous mixing to obtain a reaction mixture. The reaction mixture was subjected to a reaction in an oil bath at 150° C. for 2 minutes. Completion of the reaction was confirmed by thin layer chromatography (TLC). A reaction product thus obtained was purified by column chromatography on a silica gel column using a 9:1 v/v mixture of n-hexane and ethyl acetate as an eluent to obtain 2-(2-nitro-1-phenylethyl)-1H-pyrrole (Compound A1-2, 2.15 g, MW=216.24 g/mole, brown oil, yield: 75%). Spectrum analysis for Compound A1-2: $^1H$ NMR ($CDCl_3$, 300 MHz), δ (ppm): 4.77-4.83 (m, 1H); 4.87-5.00 (m, 2H); 6.11 (s, 1H); 6.18-6.20 (m, 2H); 6.68 (s, 1H); 4.77-4.83 (m, 1H); 7.24-7.26 (m, 2H); 7.30-7.40 (m, 3H); 7.93 (s, 1H). $^{13}C$ NMR: ($CDCl_3$, 75 MHz): 42.94, 79.23, 105.81, 108.66, 118.27, 127.96, 128.17, 128.95, 129.25, 138.03.

Preparation of Compound A1-3

Mesityl oxide (10 mL, 87.43 mmol), diphenyl diselenide (2.72 g, 8.74 mmol), and ammonium peroxydisulfate (59.83 g, 262.20 mmol) were added to anhydrous methanol (670 mL) to obtain a reaction mixture. The reaction mixture was heated under reflux in a nitrogen atmosphere for 4 hours. Completion of the reaction was confirmed by TLC. A reaction product thus obtained was added to water (1.20 L), and was then extracted using chloroform ($CHCl_3$) to obtain an organic phase. The organic phase was dried using anhydrous sodium sulfate, followed by evacuation to obtain a dark brown oily coarse product. The coarse product was purified by column chromatography on a silica gel column using a 9.3:0.7 v/v mixture of n-hexane and ethyl acetate as an eluent to obtain 1,1-dimethoxy-4-methylpent-3-en-2-one (Compound A1-3, 4.2 g, MW=158.19 g/mole, light yellow oil, yield: 30%). Spectrum analysis for Compound A1-3: $^1$H NMR ($CDCl_3$, 300 MHz), δ (ppm): 1.91 (s, 3H); 2.15 (s, 3H); 3.36 (s, 6H); 4.44 (s, 1H); 6.31 (s, 1H). $^{13}$C NMR ($CDCl_3$, 75 MHz): 21.3, 28.2, 54.5, 104.5, 119.0, 160.3, 194.2.

Preparation of Compound A1-4

Compound A1-2 (2.04 g, 9.43 mmol) was mixed with Compound A1-3 (1.79 g, 11.32 mmol, 1.2 equiv.), followed by addition of 1,8-diazodicyclo[5.4.0]undec-7-ene (DBU, 4.22 mL, 28.98 mmol) to obtain a reaction mixture. The reaction mixture was subjected to a reaction at 25° C. in a nitrogen atmosphere for 16 hours to obtain a reaction product. The reaction product was added with a saturated ammonium chloride solution, and was then extracted using ethyl acetate to obtain an organic phase. The organic phase was washed using an aqueous sodium chloride solution, and was then dried using anhydrous sodium sulfate, followed by evacuation to obtain a coarse product. The coarse product was purified by column chromatography on a silica gel column using a 9:1 v/v mixture of n-hexane and ethyl acetate as an eluent to obtain 1,1-dimethoxy-4,4-dimethyl-5-nitro-6-phenyl-6-(1H-pyrrol-2-yl)hexan-2-one (Compound A1-4, 0.88 g, MW=374.43 g/mole, light brown solid, yield: 25%).

Preparation of Compound A1-5

Compound A1-4 (730 mg, 1.95 mmol) was dissolved in anhydrous tetrahydrofuran (THF, 3.00 mL) in a flask, followed by addition of sodium methoxide ($CH_3ONa$, 316 mg, 5.85 mmol) to obtain a first reaction mixture. The first reaction mixture was subjected to a reaction at 25° C. in a nitrogen atmosphere for 1 hour to obtain a first reaction product. A $TiCl_3$ solution (12.53 mL, 9.75 mmol, 5.0 equiv.) and water (30 mL) were added to another flask, followed by addition of ammonium acetate ($NH_4OAc$, 37.58 g, 487.60 mmol) to obtain a buffer solution (pH=6.0). The $TiCl_3$ solution was prepared by dissolving a 12 wt % solution of $TiCl_3$ in a 10 wt % solution of HCl. The buffer solution was added with anhydrous THF (5 mL), followed by addition of the first reaction product to obtain a second reaction mixture. The second reaction mixture was subjected to a reaction at 25° C. in a nitrogen atmosphere for 16 hours to obtain a second reaction product, which was extracted using ethyl acetate to obtain an organic phase. The organic phase was washed using a 5% solution of sodium carbonate, and was then dried using anhydrous sodium sulfate, followed by evacuation to obtain a coarse product. The coarse product was purified by column chromatography on an alumina column using a 95:5 v/v mixture of n-hexane and ethyl acetate as an eluent to obtain 2-[(5-(dimethoxymethyl)-3,3-dimethyl-3,4-dihydro-2H-pyrrol-2-ylidene) (phenyl) methyl]-1H-pyrrole (Compound A1-5, 107 mg, MW=324.42 g/mole, bright yellow solid, yield: 17%). Spectrum analysis for Compound A1-5: $^1$H NMR ($CDCl_3$, 300 MHz), δ (ppm): 0.93 (s, 6H); 2.60 (s, 2H); 3.48 (s, 6H); 5.07 (s, 1H); 5.39 (s, 1H); 6.04-6.06 (m, 1H); 6.90 (s, 1H); 7.32-7.35 (m, 5H); 11.43 (s, 1H). $^{13}$C NMR ($CDCl_3$, 75 MHz): 28.7, 29.7, 41.8, 50.5, 54.5, 102.7, 108.1, 111.2, 119.6, 127.2, 127.3, 131.2, 134.8, 137.3, 153.9, 173.3.

Preparation of Compound A1

Compound A1-5 (50 mg, 0.154 mmol) was dissolved in acetonitrile ($CH_3CN$, 8.3 mL), followed by addition of boron trifluoride etherate ($BF_3$.$O(Et)_2$, 156 μL, 1.264 mmol) to obtain a reaction mixture, which was subjected to a reaction at 25° C. for 24 hours to obtain a reaction product. The reaction product was neutralized by adding triethylamine ($Et_3N$, 176 μL, 1.264 mmol), followed by removal of organic solvents to obtain a coarse product. The coarse product was purified by column chromatography on a silica gel column using a 1:1 v/v mixture of n-hexane and methylene chloride as an eluent to obtain Compound A1 (10.0 mg, MW=522.68 g/mole, yield: 37%). Spectrum analysis for Compound A1: $^1$H NMR ($CDCl_3$, 300 MHz), δ (ppm): −1.60 (s, 2H); 1.56 (s, 12H); 4.40 (s, 4H); 7.58-7.69 (m, 6H); 7.90-7.94 (m, 6H); 8.55 (s, 2H); 8.83 (s, 2H). $^{13}$C NMR ($CDCl_3$, 75 MHz): 29.7, 30.1, 47.3, 55.2, 99.5, 114.5, 122.2, 122.5, 126.3, 127.5, 133.8, 134.8, 138.8, 140.8, 156.2, 166.9.

Example 2

Preparation of a Bacteriochlorin-Based Organic Dye (Compound A2):

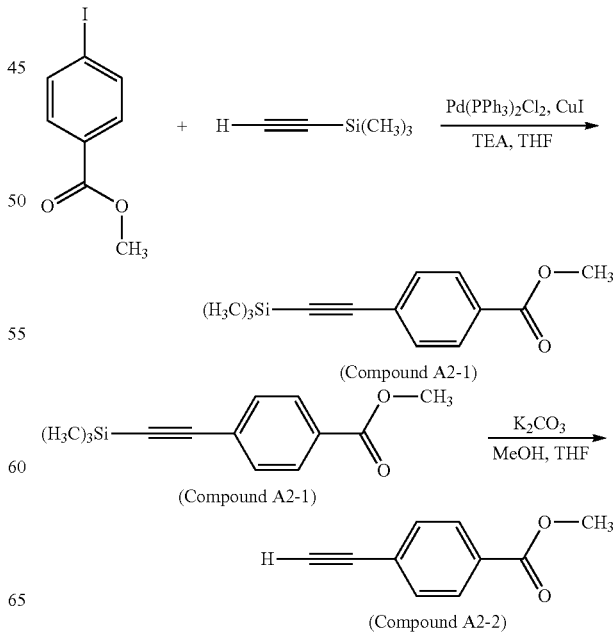

33
-continued
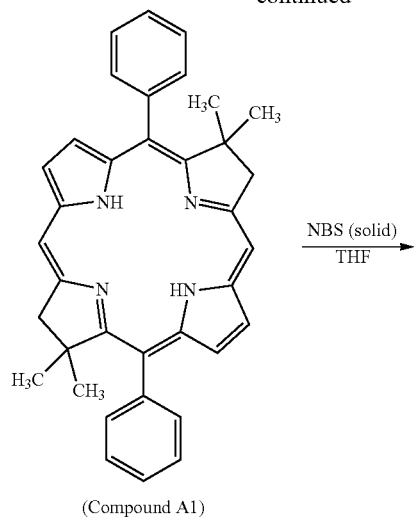
(Compound A1)
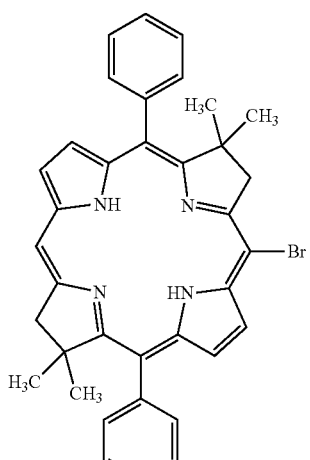
(Compound A2-3)
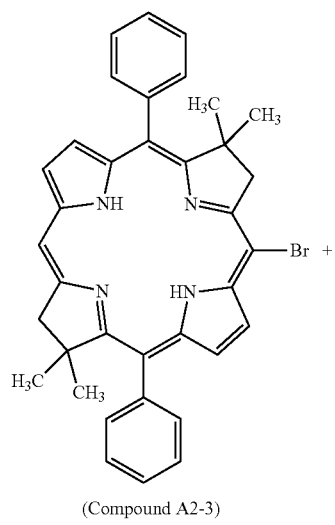
(Compound A2-3)
34
-continued
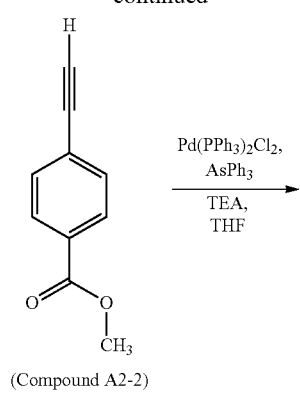
(Compound A2-2)
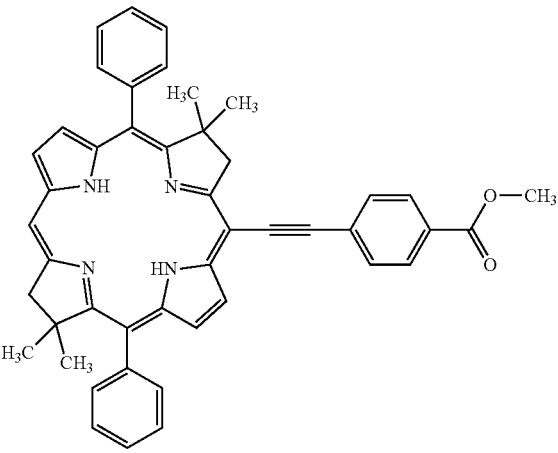
(Compound A2-4)
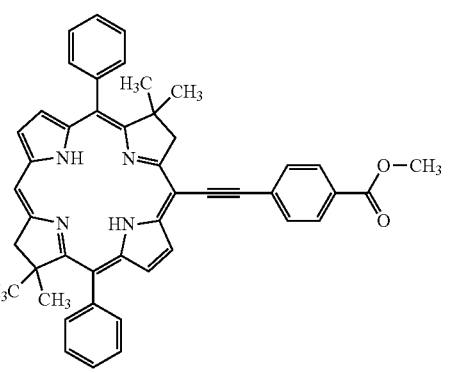
(Compound A2-4)

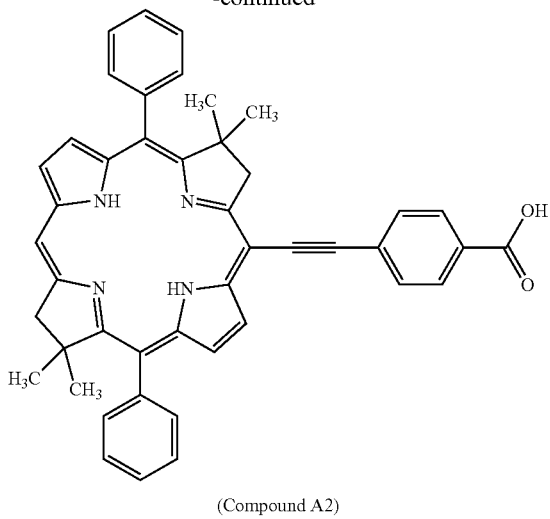

(Compound A2)

Preparation of Compound A2-1

Methyl 4-iodobenzoate (1 g, 3.816 mmol), trimethylsilylacetylene (5 mL, 35.13 mmol, 9.24 equiv.), and triethylamine (15 mL) were added into a Schlenk flask, followed by addition of anhydrous THF (15 mL) as a solvent to obtain a mixture. The mixture was degassed using a freeze/thaw cycle (three times), and was then added with $Pd(PPh_3)_2Cl_2$ (133.94 mg, 5 mol %) and copper (I) iodide (CuI, 36.34 mg, 5 mol %) within a water-free and oxygen-free glove box to obtain a reaction mixture, which was subjected to a reaction in an oil bath at 50° C. for 20 hours to obtain a reaction product. The reaction product was concentrated under reduced pressure to remove THF and triethylamine, and was dissolved in a proper volume amount of methylene chloride, followed by extraction using $NH_4Cl_{(aq)}$ in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 9:1 v/v mixture of n-hexane and ethyl acetate as an eluent to obtain methyl 4-trimethylsilyl ethynyl benzoate (Compound A2-1, 878 mg, MW=232.35 g/mole, white solid, yield: 98.5%). Spectrum analysis for Compound A2-1: $^1H$ NMR ($CDCl_3$, 300 MHz), δ (ppm): 0.25 (s, 9H); 3.90 (s, 3H); 7.50 (d, 2H, J=8.43 Hz); 7.95 (d, 2H, J=8.43 Hz). $^{13}C$ NMR ($CDCl_3$, 75 MHz): −0.2, 52.2, 97.7, 104.1, 127.8, 129.4, 129.7, 131.9, 166.5.

Preparation of Compound A2-2

Compound A2-1 (250 mg, 1.08 mmol) was dissolved in a mixture of anhydrous THF (7.5 mL) and methanol (7.5 mL), followed by adding $K_2CO_3$ to obtain a reaction mixture, which was then subjected to a reaction at 25° C. in a nitrogen atmosphere for 1 hour to obtain a reaction product. The reaction product was added with a saturated aqueous $NaHCO_3$ solution, followed by extraction using methylene chloride to obtain an organic phase. The organic phase was dried using anhydrous sodium sulfate, followed by evacuation to obtain a coarse product. The coarse product was purified by column chromatography on a silica gel column using a 9:1 v/v mixture of n-hexane and ethyl acetate as an eluent to obtain methyl 4-ethynylbenzoate (Compound A2-2, 160 mg, MW=160.17 g/mole, yield: 93.0%). Spectrum analysis for Compound A2-2: $^1H$ NMR ($CDCl_3$, 300 MHz), δ (ppm): 3.23 (s, 1H); 3.92 (s, 3H); 7.55 (d, 2H, J=8.27 Hz); 7.99 (d, 2H, J=8.27 Hz). $^{13}C$ NMR ($CDCl_3$, 75 MHz): 52.3, 80.1, 82.8, 129.5, 132.1, 166.4.

Preparation of Compound A2-3

Compound A1 (100 mg, 0.19 mmol) was dissolved in anhydrous THF (20 mL), followed by adding N-bromosuccinimide (NBS, 34 mg, 0.19 mmol) to obtain a reaction mixture, which was subjected to a reaction at 25° C. for 10 minutes to obtain a reaction product. The reaction product was added with $CH_2Cl_2$ (10 mL), and was then washed using an aqueous $NaHCO_3$ solution. An organic phase thus obtained was dried using anhydrous sodium sulfate, followed by evacuation to obtain a coarse product. The coarse product was purified by column chromatography on a silica gel column using a 1:1 v/v mixture of n-hexane and methylene chloride as an eluent to obtain Compound A2-3 (98 mg, MW=601.58 g/mole, yield: 85%). Spectrum analysis for Compound A2-3: $^1H$ NMR ($CDCl_3$, 300 MHz), δ (ppm): −1.44 (d, 2H, J=13.86 Hz); 1.51 (d, 1H, J=2.81 Hz); 4.31 (s, 2H); 4.49 (s, 2H); 7.56~7.68 (m, 6H); 7.79~7.91 (m, 6H); 8.50 (d, 1H, J=3.74 Hz); 8.68 (s, 1H); 8.90 (d, 2H, J=4.52 Hz). $^{13}C$ NMR ($d_8$-THF, 150 MHz) 171.1, 165.9, 160.4, 155.5, 141.8, 141.4, 141.3, 138.8, 138.2, 134.9, 134.5, 133.2, 131.6, 129.6, 128.6, 128.5, 127.3, 127.2, 125.8, 125.4, 123.0, 122.1, 117.4, 115.3, 101.2, 100.4, 59.2, 56.3, 54.9, 48.2, 47.4, 39.9, 31.4, 30.6, 30.3, 29.9, 24.7, 23.9, 14.4, 11.3. MALDI-TOF: calc'd for $C_{36}H_{33}BrN_4$ 600. $^{19}[M^+]$. found 601.49 $[MH]^+$.

Preparation of Compound A2-4

Compound A2-3 (10 mg, 12.91 μmol), Compound A2-2 (4.14 mg, 25.82 μmol, 2.23 equiv.), and triethylamine (1 mL) were added into a Schlenk flask, followed by addition of anhydrous THF (10 mL) as a solvent to obtain a mixture. The mixture was degassed using a freeze/thaw cycle (three times), and was then added with $Pd(PPh_3)_2Cl_2$ (2.27 mg, 30 mol %) and $AsPh_3$ (9.49 mg, 2.4 equiv.) within a water-free and oxygen-free glove box to obtain a reaction mixture, which was subjected to a reaction in an oil bath at 50° C. for 20 hours to obtain a reaction product. The reaction product was concentrated under reduced pressure to remove THF and triethylamine, and was then dissolved in a proper volume amount of methylene chloride, followed by extraction using $NH_4Cl_{(aq)}$ in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 1:1 v/v mixture of n-hexane and methylene chloride as an eluent to obtain Compound A2-4 (8.3 mg, MW=680.84 g/mole, pink solid, yield: 75%). Spectrum analysis for Compound A2-4: $^1H$ NMR ($CDCl_3$, 300 MHz), δ (ppm): −1.28 (s, 1H); −1.21 (s, 1H); 1.57 (s, 12H); 3.98 (s, 3H); 4.32 (s, 2H); 4.63 (s, 2H); 7.58-7.69 (m, 6H); 7.88-7.93 (m, 8H); 8.14 (d, 2H, J=8.25 Hz); 8.49 (d, 1H, J=3.39 Hz); 8.74 (s, 1H); 9.07 (d, 2H, J=4.12 Hz)

Preparation of Compound A2

Compound A2-4 (20 mg, 29.38 μmol) was dissolved in a mixture of THF (14 mL) and methanol (7 mL), followed by addition of an aqueous NaOH solution (8 mL, 2.5 N) to obtain a reaction mixture, which was then subjected to a reaction at 25° C. for 1 hour to obtain a reaction product. The reaction product was neutralized by adding an aqueous HCl solution (1N), followed by extraction using methylene chloride to obtain an organic phase. The organic phase was dried using anhydrous sodium sulfate, followed by evacuation to obtain a coarse product. The coarse product was purified by column chromatography on a silica gel column using a 1:9 v/v mixture of methanol and methylene chloride as an eluent to obtain Compound A2 (17 mg, MW=666.81 g/mole, pink solid, yield: 90.0%). Spectrum analysis for Compound A2: $^1$H NMR (CDCl$_3$, 300 MHz): −1.29 (s, 1H); −1.23 (s, 1H); 1.54 (d, 12H, J=14.91 Hz); 4.31 (s, 2H); 4.64 (s, 2H); 7.55~7.67 (m, 6H); 7.87-7.96 (m, 86H); 8.24 (d, 2H, J=8.12 Hz); 8.48 (d, 1H, J=4.85 Hz); 8.60 (s, 1H); 8.73 (s, 1H); 9.08 (d, 2H, J=4.63 Hz).

Example 3

Preparation of a Bacteriochlorin-Based Organic Dye (Compound A3):

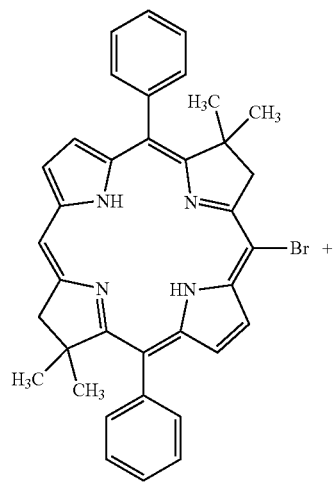

(Compound A2-3)

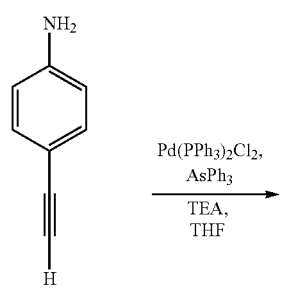

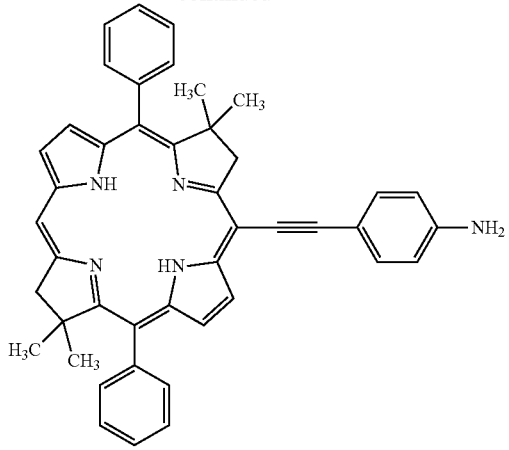

(Compound A3)

Compound A2-3 (42.1 mg, 0.070 mmol) and 4-ethynylaniline (16.4 mg, 0.14 mmol; for the synthesis method therefor, reference may be made to Dalton Trans., 2005, pp. 396-401) were dissolved in anhydrous THF (40 mL), followed by addition of triethylamine (5 mL) to obtain a mixture. The mixture was degassed using a freeze/thaw cycle (three times), and was then added with Pd(PPh$_3$)$_2$Cl$_2$ (14.74 mg, 30 mol %) and AsPh$_3$ (51.43 mg, 2.4 equiv.) within a water-free and oxygen-free glove box to obtain a reaction mixture, which was subjected to a reaction in an oil bath at 50° C. for 17 hours to obtain a reaction product. The reaction product was concentrated under reduced pressure to remove THF and triethylamine, and was then dissolved in a proper volume amount of methylene chloride, followed by extraction using NH$_4$Cl$_{(aq)}$ in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 1:1 v/v mixture of n-hexane and methylene chloride as an eluent to obtain a purified product, which was dissolved in THF, followed by recrystallization by adding a proper amount of methanol, thereby obtaining Compound A3 (30.1 mg, MW=637.81 g/mole, purple solid, yield: 67%). Spectrum analysis for Compound A3: $^1$H NMR: (CDCl$_3$, 300 MHz) −1.28 (d, 2H, J=12.24 Hz); 1.53 (d, 12H, J=9.33 Hz); 3.89 (s, 2H); 4.31 (s, 2H); 4.60 (s, 2H); 6.77 (d, 2H, J=6.77 Hz); 7.56-7.66 (m, 8H); 7.84-7.89 (m, 6H); 8.47 (dd, 1H, J=4.53 Hz, J=1.80 Hz); 8.71 (s, 1H); 9.07 (dd, 1H, J=4.67 Hz, J=2.19 Hz). $^{13}$C NMR: CDCl$_3$, 75 MHz) 168.1, 167.1, 160.7, 158.1, 150.2, 142.1, 142.0, 140.1, 139.2, 136.9, 136.7, 134.9, 134.8, 133.5, 128.6, 127.4, 123.9, 123.6, 123.1, 122.5, 116.9, 116.2, 115.0, 113.0, 112.7, 101.0, 98.4, 98.0, 91.3, 57.2, 56.0, 48.0, 47.6, 31.0, 30.4. Elemental analysis: calc'd for C$_{44}$H$_{39}$N$_5$·0.5H$_2$O: C, 81.70%, H, 6.23%, N, 10.83%. found: C, 81.66%, H, 6.08%, N, 10.75%. MALDI-TOF: calc'd for C$_{44}$H$_{39}$N$_5$ 637.32 [M$^+$]. found 637.18 [M$^+$].

Example 4
Preparation of a Bacteriochlorin-Based Organic Dye
(Compound A4):
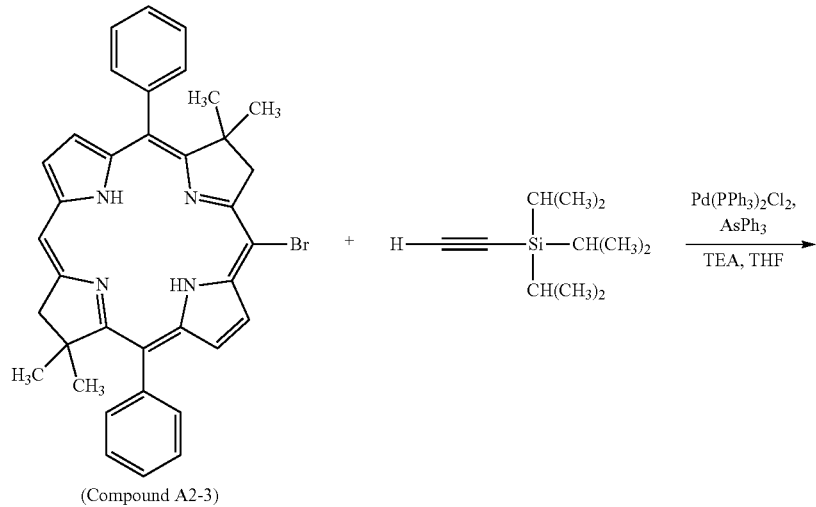
(Compound A2-3)
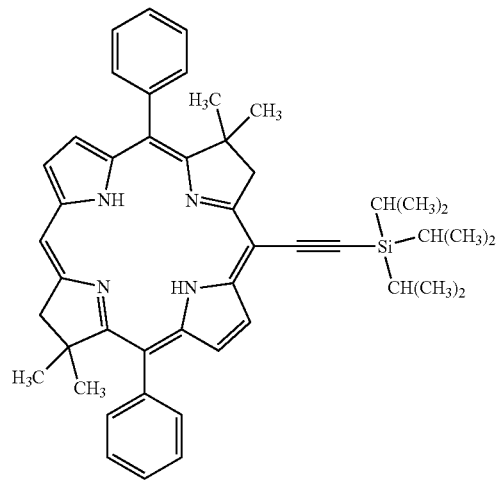
(Compound A4-1)

-continued
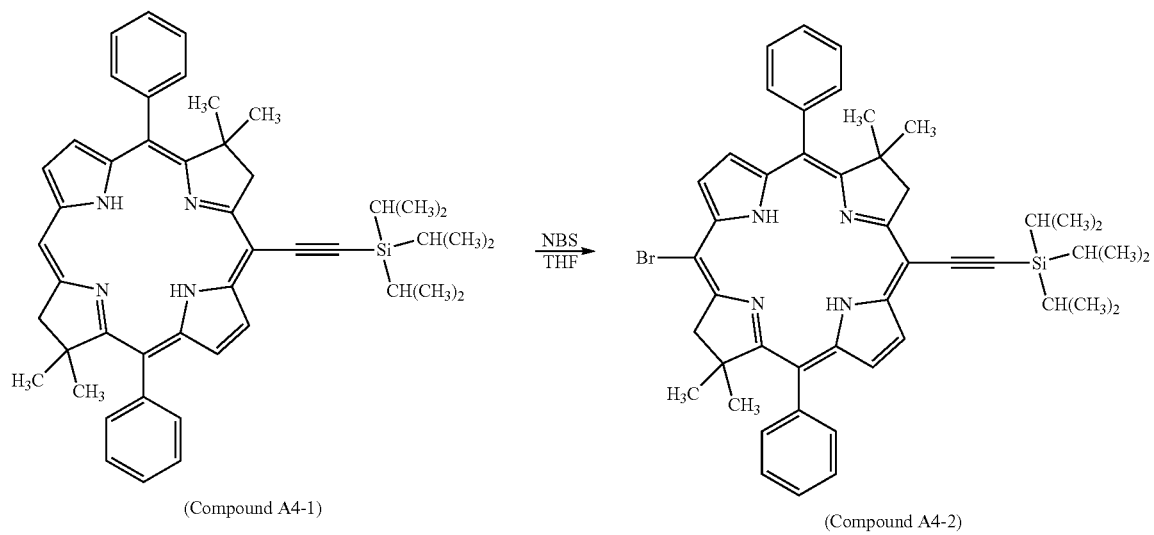
(Compound A4-1)      NBS / THF      (Compound A4-2)
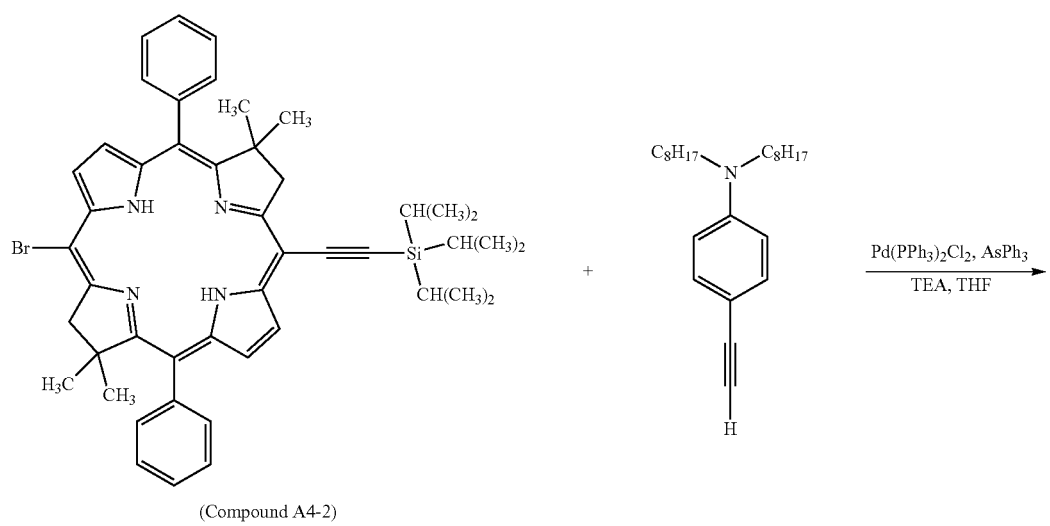
(Compound A4-2)      Pd(PPh$_3$)$_2$Cl$_2$, AsPh$_3$ / TEA, THF
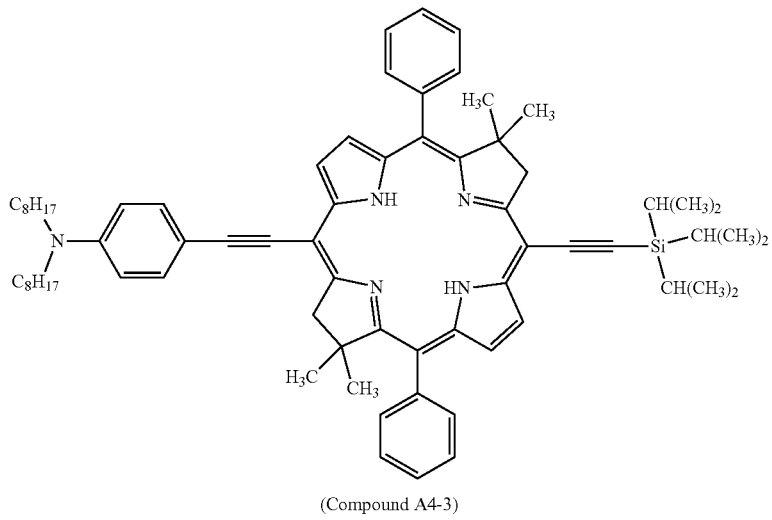
(Compound A4-3)

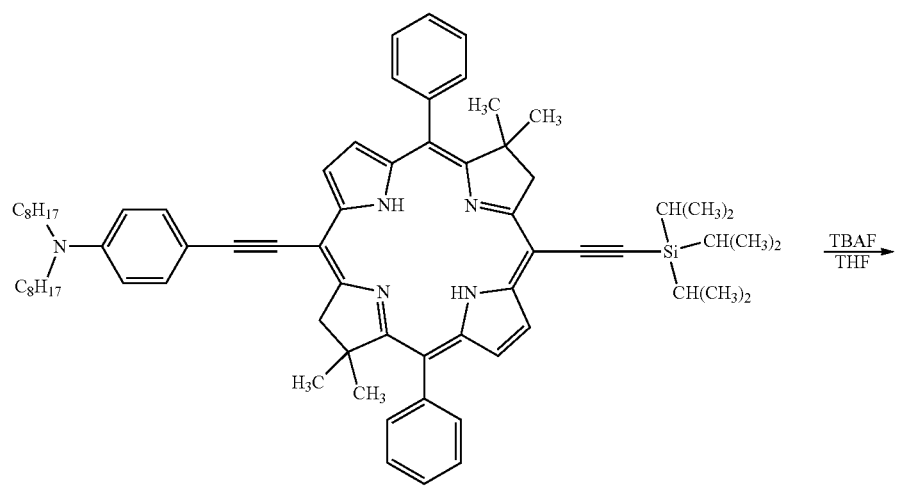
(Compound A4-3)
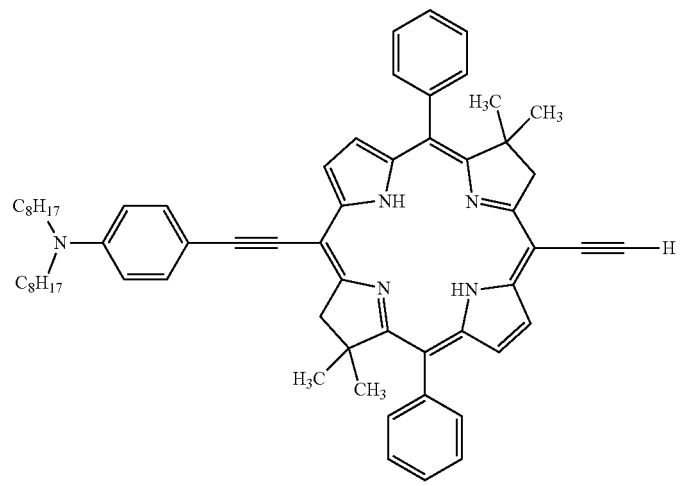
(Compound A4-4)
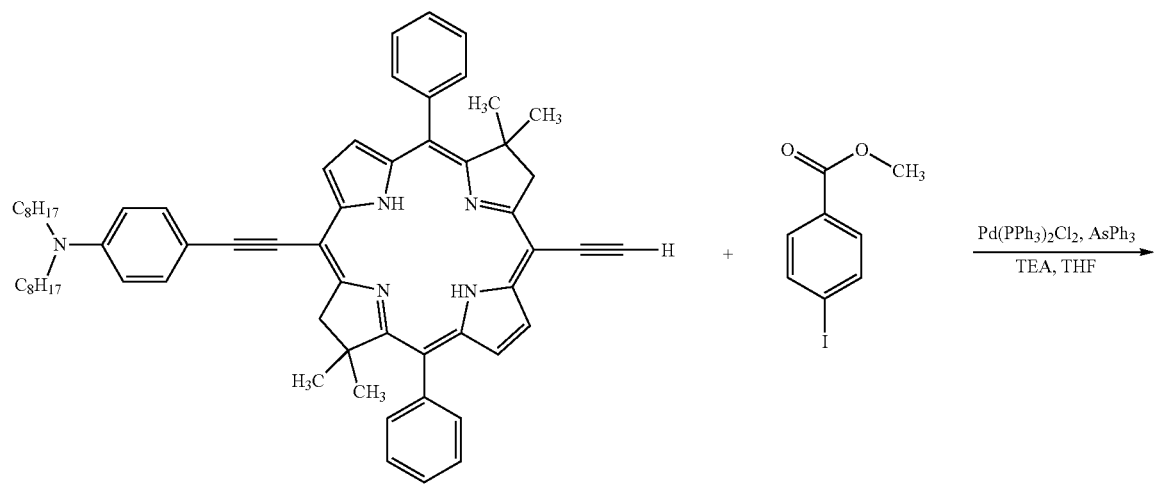
(Compound A4-4)

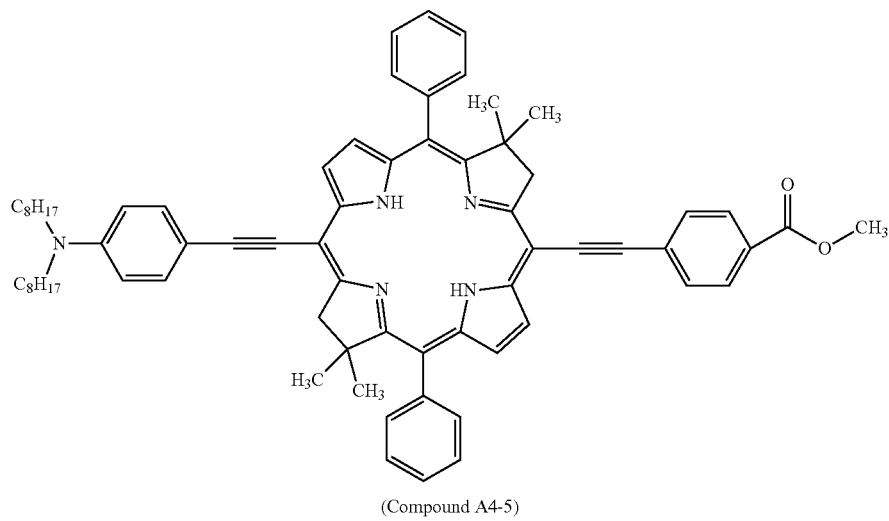
(Compound A4-5)
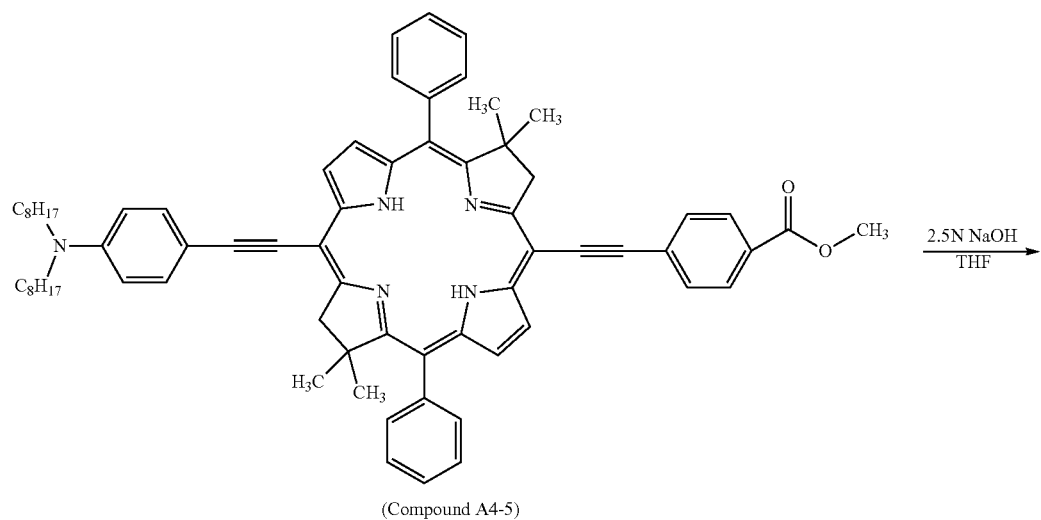
(Compound A4-5)
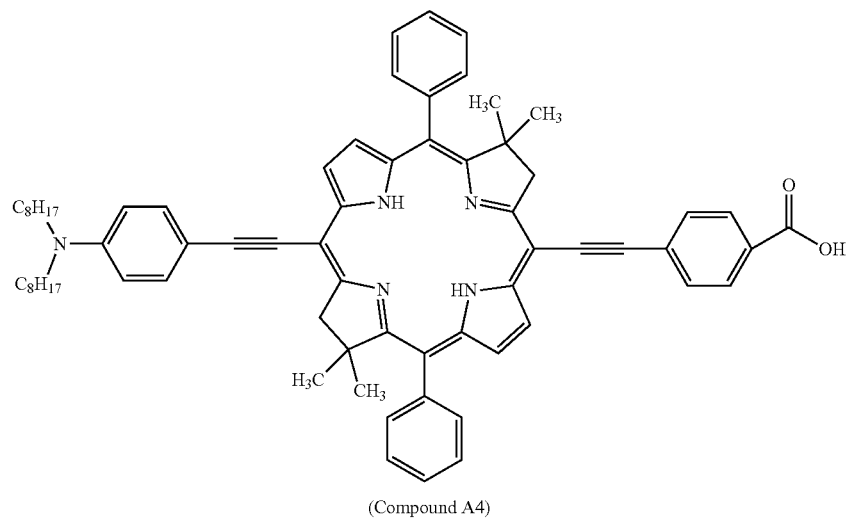
(Compound A4)

Preparation of Compound A4-1

Compound A2-3 (10 mg, 16.62 μmol), triisopropylsilylacetylene ((TIPS)-acetylene, 37 μL, 0.71 mmol), and triethylamine (1 mL) were added to anhydrous THF (10 mL) to obtain a mixture. The mixture was degassed using a freeze/thaw cycle (three times), and was then added with Pd(PPh$_3$)$_2$Cl$_2$ (3.5 mg, 4.49 μmol, 30 mol %) and AsPh$_3$ (12.2 mg, 39.89 μmol, 2.4 equiv.) within a water-free and oxygen-free glove box to obtain a reaction mixture, which was subjected to a reaction in an oil bath at 50° C. for 22 hours to obtain a reaction product. The reaction product was concentrated under reduced pressure to remove THF and triethylamine, and was dissolved in a proper volume amount of methylene chloride, followed by extraction using NH$_4$Cl$_{(aq)}$ in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 7:3 v/v mixture of n-hexane and methylene chloride as an eluent to obtain a purified product, which was dissolved in methylene chloride, followed by recrystallization by adding a proper amount of methanol, thereby obtaining Compound A4-1 (10.5 mg, MW=703.04 g/mole, pinkish green solid, yield: 90%). Spectrum analysis for Compound A4-1: $^1$H NMR: (CDCl$_3$, 300 MHz) −1.36 (s, 2H); 1.34 (s, 21H); 1.52 (d, 12H, J=2.4 Hz); 1.57 (s, 6H); 4.32 (s, 2H); 4.55 (s, 2H); 7.56-7.67 (m, 6H); 7.84-7.91 (m, 6H); 8.48 (d, 1H, J=2.7 Hz); 8.73 (s, 1H); 9.06 (d, 2H, J=2.7 Hz). MASS (MALDI-TOF): m/z calculated for C$_{47}$H$_{54}$N$_4$Si 703.04 [M]$^+$, obtained m/z 704.56[MH]$^+$.

Preparation of Compound A4-2

Compound A4-1 (100 mg, 0.14 mmol) was dissolved in anhydrous THF (120 mL), followed by addition of a solution of N-bromosuccinimide (NBS, 25.32 mg, 0.14 mmol) in anhydrous THF (10 mL) with magnetic stirring to obtain a reaction mixture. The reaction mixture was subjected to a reaction at 25° C. for 3 minutes, and was analyzed by TLC, which indicated 50% residual reactant. A solution of NBS (12.66 mg, 0.07 mmol) in anhydrous THF (5 mL) was further added, and the reaction was performed at 25° C. for additional 3 minutes. Analysis by TLC indicated that the reaction was complete. A reaction product produced thereby was added with acetone (10 mL), and was then evacuated to obtain a coarse product. The coarse product was purified by column chromatography on a silica gel column using a 1:1 v/v mixture of n-hexane and methylene chloride as an eluent to obtain a purified product, which was dissolved in methylene chloride, followed by recrystallization by adding a proper amount of methanol, thereby obtaining Compound A4-2 (67 mg, MW=781.94 g/mole, pink solid, yield: 61%). Spectrum analysis for Compound A4-2: $^1$H NMR: (CDCl$_3$, 300 MHz) −1.18 (s, 2H); 1.26 (s, 3H); 1.32 (s, 18H); 1.48 (s, 12H); 4.42 (s, 2H); 4.47 (s, 2H); 7.52-7.67 (m, 6H); 7.70-7.73 (m, 1H); 7.82-7.88 (m, 5H); 8.83 (d, 1H, J=2.64 Hz); 9.01 (d, 1H, J=3.00 Hz). $^{13}$C NMR: (d$_8$-THF, 150 MHz) 170.4, 166.8, 163.3, 156.7, 141.5, 141.3, 140.3, 139.8, 139.3, 134.7, 134.6, 134.6, 133.9, 128.8, 128.6, 127.4, 127.3, 127.2, 126.0, 124.1, 123.8, 123.2, 117.8, 117.6, 110.7, 101.9, 99.3, 97.6, 96.3, 58.9, 57.4, 48.0, 47.0, 30.7, 30.7, 30.6, 30.5, 19.4, 12.6.

Preparation of Compound A4-3

Compound A4-2 (50 mg, 63.94 μmol) and 4-ethynyl-N,N-dioctylaniline (43.68 mg, 0.128 mmol; for the synthesis method therefor, reference may be made to Energy Environ. Sci., 2012, 5, pp. 6933-6940) were dissolved in anhydrous THF (50 mL), followed by addition of triethylamine (5 mL) to obtain a mixture. The mixture was degassed using a freeze/thaw cycle (three times), and was then added with Pd(PPh$_3$)$_2$Cl$_2$ (13.46 mg, 19.18 μmol, 30 mol %) and AsPh$_3$ (46.99 mg, 153.46 μmol, 2.4 equiv) within a water-free and oxygen-free glove box to obtain a reaction solution, which was subjected to a reaction in an oil bath at 50° C. for 48 hours to obtain a reaction product. The reaction product was concentrated under reduced pressure to remove THF and triethylamine, and was dissolved in a proper volume amount of methylene chloride, followed by extraction using NH$_4$Cl$_{(aq)}$ in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 4:1 v/v mixture of n-hexane and methylene chloride as an eluent to obtain a purified product, which was dissolved in methylene chloride, followed by recrystallization by adding a proper amount of methanol, thereby obtaining Compound A4-3 (63 mg, MW=1042.60 g/mole, dark solid, yield: 94.5%). Spectrum analysis for Compound A4-3: $^1$H NMR: (CDCl$_3$, 300 MHz) −0.9 (s, 2H); 0.91 (t, 6H, 6.87 Hz); 1.26-1.35 (m, 39H); 1.50 (d, 12H, J=5.50 Hz); 1.56 (s, 6H); 3.33 (t, 4H, J=7.66 Hz); 4.49 (d, 4H, J=16.16 Hz); 6.70 (d, 2H, J=8.83 Hz); 7.57-7.68 (m, 8H); 7.79 (s, 2H); 7.86 (d, 4H, J=7.62 Hz); 8.94 (d, 1H, J=3.14 Hz); 9.00 (d, 1H, J=3.32 Hz). $^{13}$C NMR: (CDCl$_3$, 75 MHz) 167.3, 166.6, 161.1, 161.0, 147.9, 140.7, 138.7, 138.2, 137.1, 136.6, 133.8, 132.7, 127.6, 126.4, 123.2, 123.1, 122.3, 121.7, 116.8, 116.0, 111.5, 110.0, 109.8, 97.9, 97.7, 96.9, 96.0, 90.7, 56.2, 55.9, 51.1, 46.5, 46.4, 31.9, 30.5, 29.5, 29.4, 27.3, 27.2, 22.7, 19.0, 14.2, 11.8. MASS (MALDI-TOF): m/z calculated for C$_{71}$H$_{91}$N$_5$Si [M]$^+$ 1041.70, obtained m/z 1041.77[M]$^+$.

Preparation of Compound A4-4

Compound A4-3 (50 mg, 47.96 μmol) was dissolved in anhydrous THF (50 mL), followed by addition of a 1M solution of tetra-n-butylammonium fluoride (TBAF, 47.96 μL, 47.96 μmol) to obtain a reaction mixture, which was subjected to a reaction at 0° C. with stirring in darkness for 1 hour to obtain a reaction product. The reaction product was concentrated under reduced pressure to remove THF, and was dissolved in a proper volume amount of methylene chloride, followed by extraction (twice) using water in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 1:1 v/v mixture of n-hexane and methylene chloride as an eluent to obtain Compound A4-4 (35 mg, MW=886.26 g/mole, dark blue solid, yield: 82.7%). Spectrum analysis for Compound A4-4: $^1$H NMR: (CDCl$_3$, 300 MHz) −0.94 (s, 2H); 0.91 (t, 4H, J=6.87 Hz); 1.26-1.35 (m, 46H); 1.50 (d, 12H, J=5.50 Hz); 1.64 (s, 4H); 3.32 (t, 4H, J=7.66 Hz); 4.49 (d, 4H, J=16.16 Hz); 6.70 (d, 2H, J=8.83 Hz); 7.57-7.68 (m, 8H); 7.79 (s, 2H); 7.86 (d, 4H, J=7.62 Hz); 8.94 (d, 1H, J=3.30 Hz); 9.00 (d, 2H, J=4.50 Hz). $^{13}$C NMR: (CDCl$_3$, 75 MHz) 167.8, 166.5, 161.1, 160.9, 148.0, 140.6, 139.0, 138.1, 136.9, 136.7, 133.8, 133.7, 132.7, 127.7, 126.4, 123.3, 123.2, 122.7, 121.4, 117.0, 115.9, 111.5, 111.3, 109.7, 98.1, 97.9, 94.1, 90.6, 86.7, 82.8, 56.0, 55.7, 51.1, 46.7, 46.4, 31.9, 30.5, 30.4, 29.5, 29.4, 27.3, 27.2, 22.7, 14.2. MASS (MALDI-TOF): m/z calculated for $C_{62}H_{71}N_5$ $[M]^+$ 885.57, obtained m/z 886.531$[MH]^+$.

Preparation of Compound A4-5

Compound A4-4 (92 mg, 93.65 μmol) and methyl-4-bromobenzoate (49.08 mg, 0.187 mmol) were dissolved in anhydrous THF (9 mL), followed by addition of triethylamine (9 mL) to obtain a mixture. The mixture was degassed using a freeze/thaw cycle (three times), and was then added with $Pd_2(dba)_3$ (25.73 mg, 28.10 μmol, 30 mol %) and $AsPh_3$ (68.83 mg, 224.76 μmol) within a water-free and oxygen-free glove box to obtain a reaction mixture, which was subjected to a reaction in an oil bath at 50° C. for 22 hours to obtain a reaction product. The reaction product was concentrated under reduced pressure to remove THF and triethylamine, and was dissolved in a proper volume amount of methylene chloride, followed by extraction using $NH_4Cl_{(aq)}$ in a volume amount equal to that of methylene chloride to obtain an organic phase. The organic phase was dried using anhydrous sodium sulfate followed by evacuation to obtain a coarse product. The coarse product was purified by column chromatography on a silica gel column using a 1:1 v/v mixture of n-hexane and methylene chloride as an eluent to obtain Compound A4-5 (90.45 mg, MW=1020.39 g/mole, dark blue solid, yield: 94.65%). Spectrum analysis for Compound A4-5: $^1$H NMR: ($CDCl_3$, 300 MHz) −0.85 (d, 2H, d, J=9.75 Hz); 0.90 (t, 6H, 6.54 Hz); 1.25-1.35 (m, 22H); 1.52 (d, 12H, J=6.44 Hz); 1.61 (s, 6H); 3.33 (t, 4H, J=7.37 Hz); 3.97 (s, 3H); 4.53 (d, 4H, J=7.67 Hz); 6.70 (d, 2H, J=8.53 Hz); 7.57-7.67 (m, 8H); 7.81 (s, 2H); 7.87 (d, 6H, J=6.09 Hz); 8.13 (d, 2H, J=8.40 Hz); 8.94 (d, 1H, J=3.48 Hz); 9.01 (d, 1H, J=3.47 Hz). $^{13}$C NMR: ($CDCl_3$, 75 Hz) 167.7, 166.8, 166.5, 161.3, 160.7, 148.0, 140.5, 139.1, 138.1, 136.8, 136.4, 133.8, 133.7, 132.7, 131.1, 129.8, 129.2, 128.9, 127.7, 126.4, 123.4, 123.1, 122.7, 121.1, 117.3, 116.1, 111.5, 111.3, 109.6, 98.3, 98.1, 96.7, 95.1, 94.9, 90.6, 55.9, 55.6, 52.3, 51.1, 46.7, 46.4, 31.9, 30.4, 29.5, 29.4, 27.3, 27.2, 22.7, 14.1. MASS (MALDI-TOF): m/z calculated for $C_{70}H_{77}N_5O_2$ 1019.61 $[M]^+$, obtained m/z 1020.63$[MH]^+$.

Preparation of Compound A4

Compound A4-5 (180 mg, 17.64 mmol) was dissolved in a mixture of THF (100 mL) and methanol (100 mL), followed by addition of an aqueous NaOH solution (2.5 N, 100 mL) to obtain a reaction mixture. The reaction mixture was subjected to a reaction at 25° C. for 1 hour, followed by addition of an aqueous HCl solution (1 N) until a pH value of 3 was reached. A reaction product thus obtained was concentrated under reduced pressure to remove the solvents, and was dissolved in a proper volume amount of methylene chloride, followed by extraction (twice) using water in a volume amount equal to that of methylene chloride to obtain an organic phase. The organic phase was dried using anhydrous sodium sulfate, followed by evacuation to obtain a coarse product. The coarse product was purified by column chromatography on a silica gel column using a 9:1 v/v mixture of methanol and chloroform as an eluent to obtain Compound A4 (110 mg, MW=1006.37 g/mole, dark blue solid, yield: 62%). Spectrum analysis for Compound A4: $^1$H NMR: ($d_8$-THF, 600 MHz) −0.84 (d, 2H, J=15.15 Hz); 0.91 (t, 6H, J=6.81 Hz); 1.33-1.39 (m, 6H); 1.53 (d, 12H, J=9.07 Hz); 1.62-1.68 (m, 6H); 3.38-3.41 (m, 4H); 4.55 (s, 2H); 4.60 (s, 2H); 6.76 (d, 2H, J=8.66 Hz); 7.61-7.69 (m, 8H); 7.80-7.82 (m, 2H); 7.90-7.93 (m, 6H); 8.14 (d, 2H, J=8.20 Hz); 8.99-9.01 (m, 2H). $^{13}$C NMR: ($d_8$-THF, 150 MHz) 168.3, 167.2, 161.7, 161.5, 149.0, 141.6, 139.8, 139.0, 137.5, 137.3, 134.7, 134.6, 133.4, 131.7, 130.7, 128.6, 127.3, 127.2, 123.9, 123.8, 123.2, 121.9, 118.2, 117.1, 112.4, 110.8, 99.3, 99.3, 96.6, 96.2, 95.9, 91.1, 56.8, 56.5, 51.7, 47.5, 47.2, 32.8, 30.7, 30.6, 30.5, 30.3, 28.2, 28.0, 23.5, 14.4.

Property Evaluation:

1. Maximum Absorption Wavelength and Molar Extinction Coefficient:

The maximum absorption wavelength ($\lambda_{max}$, nm) and molar extinction coefficient ($\epsilon$, $10^{-3}M^{-1}cm^{-1}$) of a compound were determined using an Agilent 8453 UV-Vis spectrophotometer. Each of samples obtained from Compound A1 (Example 1), Compound A2 (Example 2), and Compound A4 (Example 4) was dissolved in THF, and was determined at 298 K in a concentration range from $10^{-5}$ M to $10^{-6}$ M and in a wavelength range from 300 nm to 1100 nm.

2. Maximum Emission Wavelength:

The maximum emission wavelength ($\lambda_{max}$, nm) of a compound was determined using an Agilent Eclipse fluorescence spectrophotometer. A sample obtained from Compound A1 (Example 1) was dissolved in THF, and was determined at 298 K at an excitation wavelength of 370 nm. A sample obtained from Compound A2 (Example 2) was dissolved in THF, and was determined at 298 K at an excitation wavelength of 372 nm. A sample obtained from Compound A4 (Example 4) was dissolved in THF, and was determined at 298 K at an excitation wavelength of 388 nm. These determinations were performed at a concentration of $2\times10^{-6}$ M in a wavelength range from 390 nm to 900 nm at a scan speed of 600 nm/min.

3. Performances of Dye-Sensitized Solar Cell:

Since the configuration and manufacture of a dye-sensitized solar cell are well known in the art, only a brief description thereof is provided below.

A dye-sensitized solar cell includes an electrolyte, an anode, and a cathode. In the dye-sensitized solar cell illustrated in the disclosure, the electrolyte is composed of a 1 M solution of 1-methyl 3-propyl imidazolium iodide (PMII), a 0.05 M solution of $I_2$, a 0.2 M solution of lithium iodide (LiI), and a 0.5 M solution of tert-butyl pyridine (TBP). The cathode is made from platinum. The anode is composed of four transparent active layers of $TiO_2$ (manufactured by Eternal Chemical, particle size distribution: 20 nm to 40 nm), two scattering layers of $TiO_2$ (manufactured by Eternal Chemical, particle size distribution: 300 nm to 400 nm), and the bacteriochlorin-based organic dye of the disclosure used as a photosensitizer. The anode was made by immersing a laminate formed from the four transparent active layers and the two scattering layers in a 0.1 mM solution of the bacteriochlorin-based organic dye of the disclosure in THF for 6 hours.

The open-circuit voltage, short-circuit current, fill factor, and photoelectric conversion efficiency of the dye-sensitized solar cell were determined using a solar simulator (AM 1.5G, SS50 AAAEM, PET) and a source meter (Keithley 2400). The dye-sensitized solar cell having a size of 0.4 cm×0.4 cm was placed at a measurement position where the dye-sensitized solar cell could be irradiated by the solar simulator, and was scanned at a scan range from −0.1 V to 0.8 V with a scan pitch of 0.02 V. A photocurrent versus voltage (I-V) curve measurement software (Forter, FIV-MAS) was used to determine the open-circuit voltage, the short-circuit current, the fill factor, and the photoelectric conversion efficiency of the dye-sensitized solar cell.

4. Incident Photon-to-Electron Conversion Efficiency (IPCE):

Determination of incident photon-to-current conversion efficiency (IPCE) was performed by a 7-SCSpec system (Sofn Instruments Co., Ltd.) with an xenon lamp (7ILT250A, Sofn Instruments Co., Ltd.), a tungsten-halogen lamp (7ILT250A, Sofn Instruments Co., Ltd.), and a source meter (Keithley 2000). After spectrum calibration, the dye-sensitized solar cell was placed at a measurement position where the dye-sensitized solar cell may be irradiated by the lamps, was scanned at a scan range from 300 nm to 900 nm with a scan pitch of 10 nm to obtain a spectrum of IPCE, which was integrated to obtain a theoretical short-circuit current density.

TABLE 3

| | UV absorption spectrum wavelength/Log ε (nm/M$^{-1}$cm$^{-1}$) | Emission spectrum $\lambda_{max}$ (nm) |
| --- | --- | --- |
| Ex. 1 (Compound A1) | 348/5.57 370/5.70 503/5.15 718/5.52 | 724 |
| Ex. 2 (Compound A2) | 372/5.38 551/5.01 745/5.36 | 749 |
| Ex. 4 (Compound A4) | 388/5.22 576/4.65 615/4.69 701/4.21 769/5.19 | 774 |

TABLE 4

| | IPCE | Photoelectric conversion performances | | | |
| --- | --- | --- | --- | --- | --- |
| Dye-sensitized solar cell | integrated current density from the spectrum (mA cm$^{-2}$) | short-circuit current density ($J_{sc}$) (mA cm$^{-2}$) | Open-circuit voltage ($V_{oc}$) (V) | Fill factor (FF) | photoelectric conversion efficiency (η) (%) |
| Ex. 2 (Compound A2) | 10.29 | 12.58 | 0.53 | 0.70 | 4.67 |
| Ex. 4 (Compound A4) | 14.99 | 16.13 | 0.52 | 0.64 | 5.36 |

Figure 2:
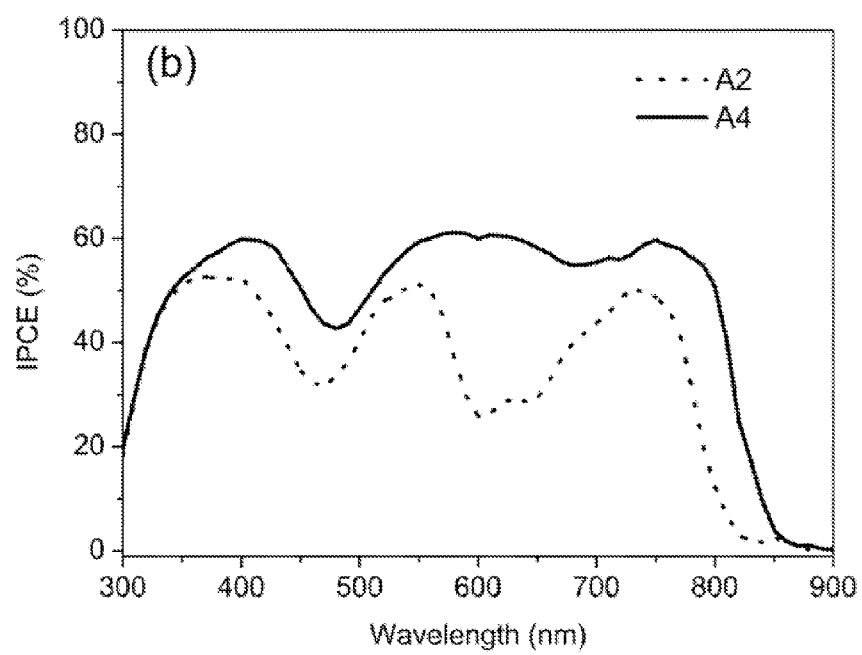
FIG. 2 is a graph showing incident photon-to-current conversion efficiency (IPCE) spectra of solar cells sensitized with Compounds A2 and A4.

Current density-voltage (J-V) curves of Compounds A2 and A4 obtained under irradiance of 100 mW/cm$^2$ are shown in FIG. 1. IPCE spectra of solar cells sensitized with Compounds A2 and A4 are shown in FIG. 2

Compound A1 prepared in Example 1 has two methyl gropus on each of the carbon atoms at positions 7 and 17 of the bacteriochlorin core, and is thus stable in air. Therefore, Compound A1 may be used to prepare Compounds A2 and A4 in Examples 2 and 4, i.e., the bacteriochlorin-based organic dyes. As shown in Table 4, the bacteriochlorin-based organic dyes prepared in Examples 2 and 4 have satisfactory photoelectric conversion performances.

In fact, we observed that the compounds prepared in the illustrated examples were not oxidized to corresponding chlorin or porphyrin compounds during synthesis and purification thereof, preparation of a solar cell made therefrom, and measurement of properties thereof. The procedures for the synthesis, purification, preparation, and measurement are often carried out in air at room or elevated temperatures for hours, days, or weeks.

In view of the aforesaid, the bacteriochlorin-based organic dye of the disclosure may be stably prepared from a bacteriochlorin-based compound which has two substituents on each of the carbon atoms at positions 7 and 17 of the bacteriochlorin core. Therefore, the bacteriochlorin-based organic dye of the disclosure is stable in air, and may be used as a photosensitizer in dye-sensitized solar cell.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A bacteriochlorin-based organic dye represented by Formula (II):

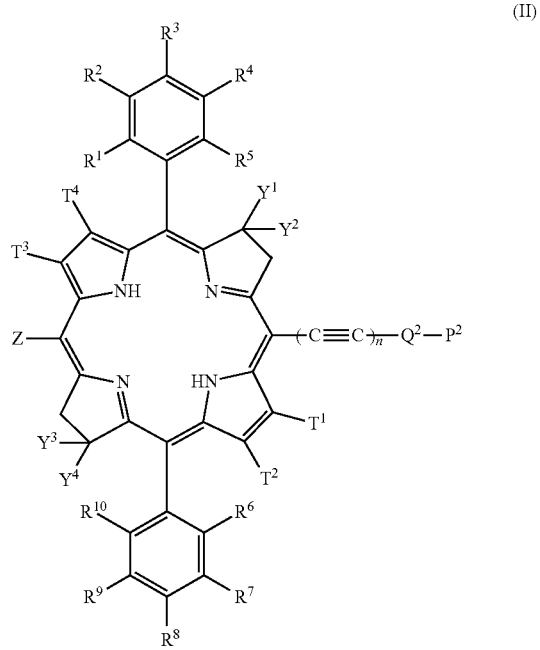

wherein
$R^1$, $R^2$, $R^3$, $R^4$, $R^5$, $R^6$, $R^7$, $R^8$, $R^9$, and $R^{10}$ are independently selected from the group consisting of hydrogen, an alkyl group, and an alkoxy group;
$Y^1$, $Y^2$, $Y^3$, and $Y^4$ independently represent an alkyl group;

T¹, T², T³, and T⁴ are independently selected from the group consisting of hydrogen, an alkyl group, and an alkoxy group;

Q² is selected from the group consisting of a single bond,

,

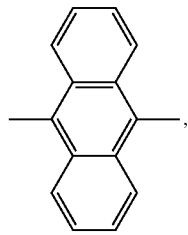,

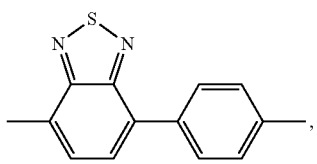,

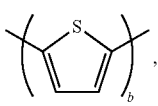,

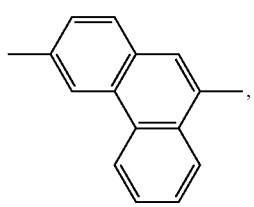,

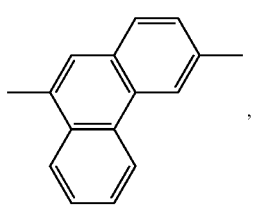,

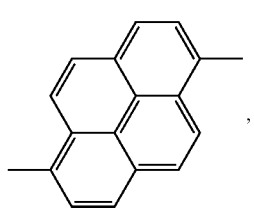,

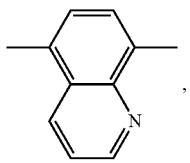, and

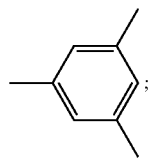;

P² represents an amino group or an anchoring group;

n represents 0 or 1; and

Z represents H,

, or NR¹⁴R¹⁵, wherein

P¹ represents hydrogen, an electron-donating group, or an electron-withdrawing group, m represents 0 or 1, R¹⁴ and R¹⁵ are independently selected from the group consisting of hydrogen, a C₁-C₁₂ alkyl group, and

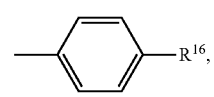, wherein R¹⁶ represents a C₁-C₁₂ alkyl group or a C₁-C₁₂ alkoxy group, and Q¹ is selected from the group consisting of a single bond,

,

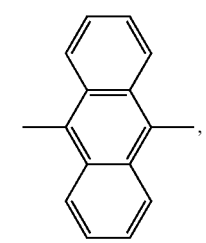,

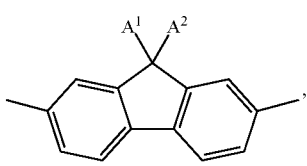

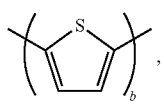

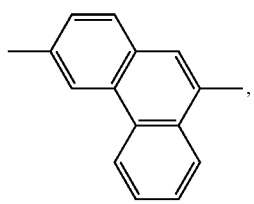

and

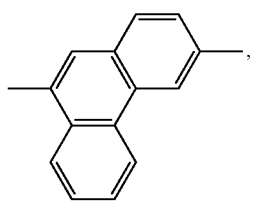

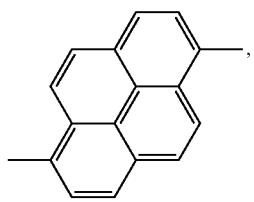

wherein $A^1$ and $A^2$ independently represent a $C_1$-$C_{12}$ alkyl group, and b represents an integer ranging from 1 to 4.

2. The bacteriochlorin-based organic dye according to claim 1, wherein Z represents

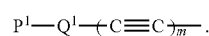

3. The bacteriochlorin-based organic dye according to claim 2, wherein $P^1$ is selected from the group consisting of hydrogen, $NR^{11}R^{12}$, and a hydroxyl group, wherein $R^{11}$ and $R^{12}$ are independently selected from the group consisting of hydrogen, a $C_1$-$C_{12}$ alkyl group, and

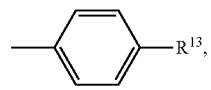

wherein $R^{13}$ represents a $C_1$-$C_{12}$ alkyl group or a $C_1$-$C_{12}$ alkoxy group; and $P^2$ is selected from the group consisting of —$NH_2$, a carboxyl group, and a nitro group.

4. The bacteriochlorin-based organic dye according to claim 2, wherein $Q^1$ is selected from the group consisting of a single bond,

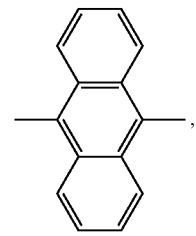

and

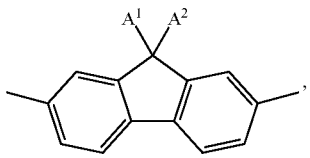

wherein $A^1$ and $A^2$ independently represent a $C_1$-$C_{12}$ alkyl group.

5. The bacteriochlorin-based organic dye according to claim 2, wherein $Q^2$ is selected from the group consisting of

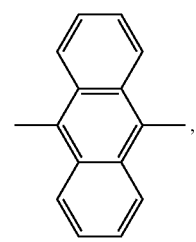

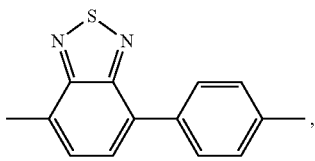

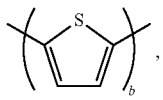

and

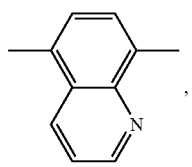

wherein b represents an integer ranging from 1 to 4.

6. The bacteriochlorin-based organic dye according to claim 2, wherein
m is 0;
$Q^1$ represents a single bond; and
$P^1$ represents hydrogen or $NR^{11}R^{12}$, wherein $R^{11}$ and $R^{12}$ independently represent

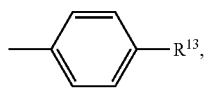

wherein $R^{13}$ represents a $C_1$-$C_{12}$ alkyl group or a $C_1$-$C_{12}$ alkoxy group.

7. The bacteriochlorin-based organic dye according to claim 2, wherein said alkyl group for $R^1$, $R^2$, $R^3$, $R^4$, $R^5$, $R^6$, $R^7$, $R^8$, $R^9$, $R^{10}$, $Y^1$, $Y^2$, $Y^3$, $Y^4$, $T^1$, $T^2$, $T^3$, and $T^4$ is a $C_6$-$C_{12}$ alkyl group, and said alkoxy group for $R^1$, $R^2$, $R^3$, $R^4$, $R^5$, $R^6$, $R^7$, $R^8$, $R^9$, $R^{10}$, $T^1$, $T^2$, $T^3$, and $T^4$ is a $C_6$-$C_{12}$ alkoxy group.

8. The bacteriochlorin-based organic dye according to claim 2, wherein each of $R^1$, $R^2$, $R^3$, $R^4$, $R^5$, $R^6$, $R^7$, $R^8$, $R^9$, $R^{10}$ represents hydrogen.

9. The bacteriochlorin-based organic dye according to claim 2, wherein $R^1$, $R^5$, $R^6$, and $R^{10}$ independently represent an alkyl group or an alkoxy group, and each of $R^2$, $R^3$, $R^4$, $R^7$, $R^8$, and $R^9$ represents hydrogen.

10. The bacteriochlorin-based compound according to claim 2, wherein each of $T^1$, $T^2$, $T^3$, and $T^4$ represents hydrogen.

11. The bacteriochlorin-based compound according to claim 2, wherein $T^1$, $T^2$, $T^3$, and $T^4$ independently represent an alkyl group or an alkoxy group.

12. The bacteriochlorin-based compound according to claim 1, wherein Z represents $NR^{14}R^{15}$.

13. The bacteriochlorin-based compound according to claim 12, wherein each of $R^{14}$ and $R^{15}$ represents

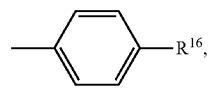

wherein $R^{16}$ represents a $C_1$-$C_{12}$ alkyl group or a $C_1$-$C_{12}$ alkoxy group.

14. The bacteriochlorin-based compound according to claim 1, wherein $Q^2$ is

and $P^2$ represents said anchoring group which is bonded to Q2 at a para position and which is selected from the group consisting of a carboxylic group and a hydroxamic group.

15. The bacteriochlorin-based compound according to claim 1, wherein $Q^2$ is

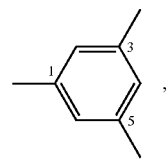

and $P^2$ represents a carboxylic group bonded to $Q^2$ at each of positions 3 and 5 of $Q^2$.

16. The bacteriochlorin-based compound according to claim 1, wherein said electron-withdrawing group is selected from the group consisting of

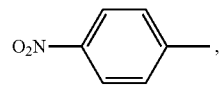

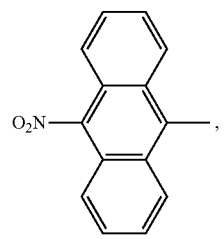 [SMILES: Cc1c2ccccc2c([N+](=O)[O-])c2ccccc12]

and

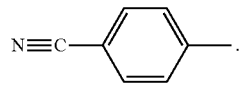

* * * * *